United States Patent
Kanai

(10) Patent No.: US 7,139,193 B2
(45) Date of Patent: Nov. 21, 2006

(54) NON-VOLATILE MEMORY WITH TWO ADJACENT MEMORY CELLS SHARING SAME WORD LINE

(75) Inventor: Masahiro Kanai, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 10/779,683

(22) Filed: Feb. 18, 2004

(65) Prior Publication Data

US 2004/0228174 A1 Nov. 18, 2004

(30) Foreign Application Priority Data

Feb. 21, 2003 (JP) ............................. 2003-044289

(51) Int. Cl.
*G11C 11/34* (2006.01)
(52) U.S. Cl. ....................... 365/185.05; 365/185.29; 365/230.03
(58) Field of Classification Search ........... 365/230.01, 365/230.03, 185.02, 185.05, 185.29, 189.04, 365/158; 257/202, 208, 211
See application file for complete search history.

(56) References Cited

U.S. PATENT DOCUMENTS

| | | | |
|---|---|---|---|
| 5,408,115 A | 4/1995 | Chang | 257/324 |
| 5,422,504 A | 6/1995 | Chang et al. | 257/316 |
| 5,494,838 A | 2/1996 | Chang et al. | 437/43 |
| 5,969,383 A | 10/1999 | Chang et al. | 257/316 |
| 6,069,824 A * | 5/2000 | Kojima et al. | 365/185.23 |
| 6,177,318 B1 | 1/2001 | Ogura et al. | 438/267 |
| 6,248,633 B1 | 6/2001 | Ogura et al. | 438/267 |
| 6,255,166 B1 | 7/2001 | Ogura et al. | 438/257 |
| 6,587,380 B1 | 7/2003 | Kanai et al. | 365/185.28 |
| 6,587,381 B1 | 7/2003 | Kanai et al. | 365/185.28 |
| 6,646,916 B1 | 11/2003 | Kamei | 365/185.11 |
| 6,650,591 B1 | 11/2003 | Owa | 365/230.03 |
| 6,654,282 B1 | 11/2003 | Kanai | 365/185.05 |
| 6,697,280 B1 | 2/2004 | Natori | 365/185.05 |
| 6,704,224 B1 | 3/2004 | Natori | 365/185.18 |
| 6,707,695 B1 | 3/2004 | Owa | 365/63 |
| 6,707,716 B1 | 3/2004 | Natori | 365/185.18 |
| 6,707,720 B1 | 3/2004 | Kamei et al. | 365/185.33 |
| 6,707,742 B1 | 3/2004 | Kamei | 365/210 |

(Continued)

FOREIGN PATENT DOCUMENTS

JP 05-266678 10/1993

(Continued)

OTHER PUBLICATIONS

Hayashi et al. "Twin MONOS Cell with Dual Control Gates", 2000 Symposium on VLSI Technology Digest of Technical Papers.

(Continued)

*Primary Examiner*—Richard Elms
*Assistant Examiner*—Alexander Sofocleous
(74) *Attorney, Agent, or Firm*—Oliff & Berridge, PLC

(57) ABSTRACT

A nonvolatile semiconductor memory device having a small layout size includes a memory cell array in which a plurality of memory cells are arranged in a row direction and a column direction. The memory cell array includes a plurality of element isolation regions. Each of the memory cells includes a source region, a drain region, a channel region located between the source region and the drain region, a select gate and a word gate disposed to face the channel region, and a nonvolatile memory element formed between the word gate and the channel region. A wordline connection section which connects at least one of a plurality of word gate interconnects in an upper layer with at least one of the word gates is disposed over at least one of the element isolation regions.

12 Claims, 21 Drawing Sheets

U.S. PATENT DOCUMENTS

| | | | |
|---|---|---|---|
| 6,710,399 B1 | 3/2004 | Kamei | 257/319 |
| 6,717,854 B1 | 4/2004 | Natori | 365/185.18 |
| 6,738,291 B1 | 5/2004 | Kamei | 365/185.18 |
| 6,744,106 B1 | 6/2004 | Kanai | 257/390 |
| 6,757,197 B1 | 6/2004 | Kamei | 365/185.23 |
| 6,759,290 B1* | 7/2004 | Ogura et al. | 438/200 |
| 6,760,253 B1 | 7/2004 | Kamei | 365/185.11 |
| 6,762,960 B1 | 7/2004 | Natori | 365/189.09 |
| 2002/0191453 A1 | 12/2002 | Owa | 365/200 |
| 2003/0022441 A1* | 1/2003 | Ogura et al. | 438/257 |
| 2003/0025149 A1 | 2/2003 | Kanai | 257/315 |
| 2003/0025150 A1 | 2/2003 | Kanai et al. | 257/315 |
| 2003/0027411 A1 | 2/2003 | Kanai | 438/506 |
| 2003/0072191 A1 | 4/2003 | Kamei | 365/200 |
| 2003/0072194 A1 | 4/2003 | Kamei | 365/200 |
| 2003/0085443 A1 | 5/2003 | Natori | 365/189.09 |
| 2003/0151070 A1 | 8/2003 | Natori | 257/200 |
| 2003/0164517 A1 | 9/2003 | Kamei | 257/314 |
| 2003/0174558 A1 | 9/2003 | Kamei | 365/200 |
| 2003/0179609 A1 | 9/2003 | Natori | 365/189.09 |
| 2003/0198102 A1* | 10/2003 | Kamei et al. | 365/200 |
| 2003/0198103 A1 | 10/2003 | Kamei | 365/200 |
| 2004/0013018 A1 | 1/2004 | Kanai | 365/202 |
| 2004/0013027 A1 | 1/2004 | Kanai | 365/236 |
| 2004/0061139 A1 | 4/2004 | Natori | 257/200 |
| 2004/0151045 A1 | 8/2004 | Kanai | 365/203 |
| 2004/0228181 A1* | 11/2004 | Maemura | 365/199 |
| 2004/0228185 A1* | 11/2004 | Owa | 365/202 |
| 2004/0229407 A1* | 11/2004 | Owa | 438/128 |
| 2004/0232474 A1* | 11/2004 | Maemura | 257/315 |
| 2005/0001261 A1* | 1/2005 | Natori | 257/316 |

FOREIGN PATENT DOCUMENTS

| | | |
|---|---|---|
| JP | 06-151782 | 5/1994 |
| JP | A 6-181319 | 6/1994 |
| JP | A 7-161851 | 6/1995 |
| JP | A 11-74389 | 3/1999 |
| JP | B1 2978477 | 9/1999 |
| JP | A 2001-156188 | 6/2001 |
| JP | 2002-353346 | 12/2002 |
| JP | 2002-357863 | * 12/2002 |
| JP | 2003-037191 | 2/2003 |

OTHER PUBLICATIONS

Chang et al. "A New SONOS Memory using Source-Side Injection for Programming", IEEE Electron Device Letters, vol. 19, No. 7, Jul. 1998, pp. 253-255.

Chen et al. A Novel Flash Memory Device with S Plit Gate Source Side Injection and ONO Charge Storage Stack (SPIN), 1997 Symposium on VLSI Technology Digest of Technical Papers, pp. 63-64.

* cited by examiner

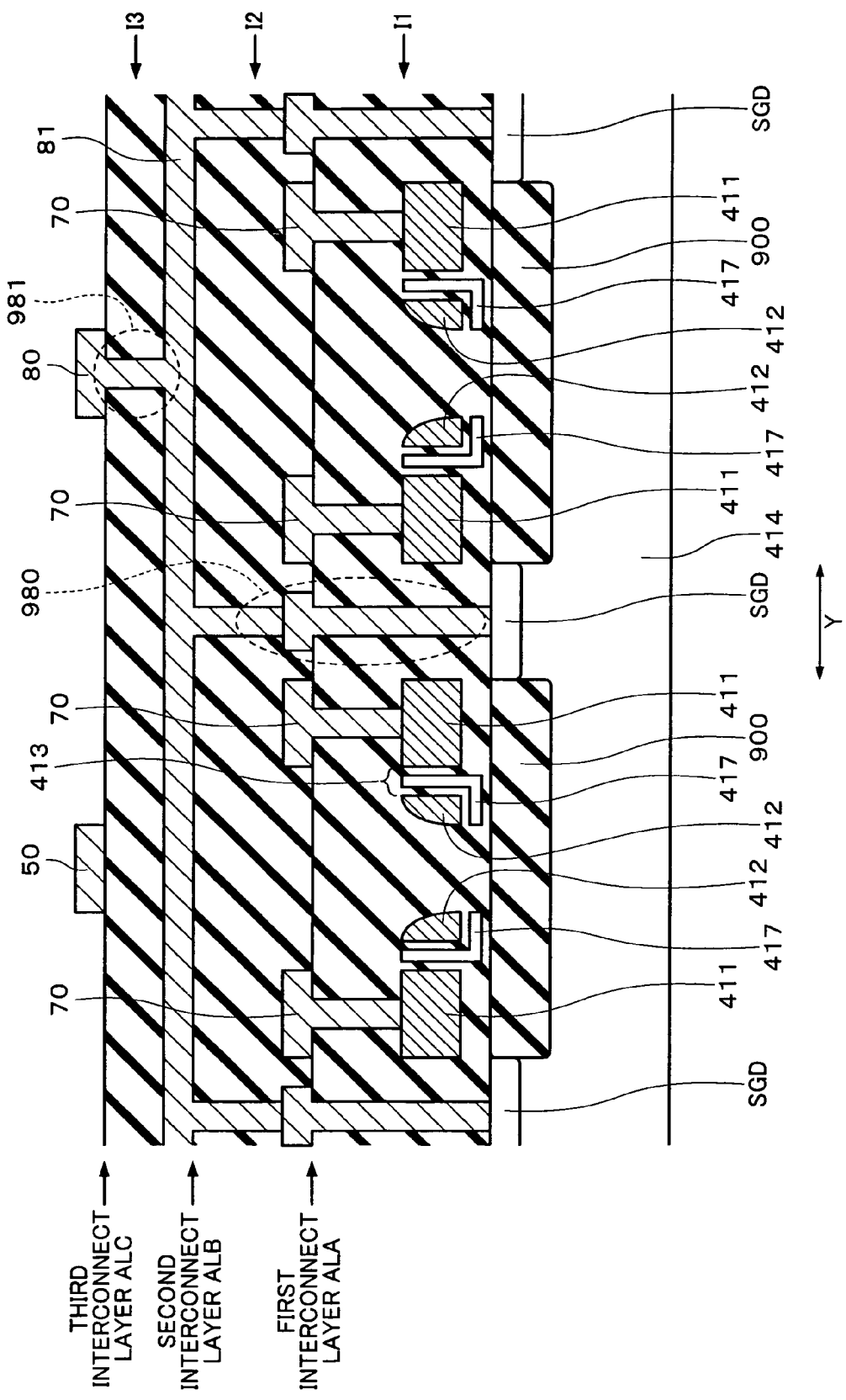

US 7,139,193 B2

NON-VOLATILE MEMORY WITH TWO ADJACENT MEMORY CELLS SHARING SAME WORD LINE

Japanese Patent Application No. 2003-44289, filed on Feb. 21, 2003, is hereby incorporated by reference in its entirety.

BACKGROUND OF THE INVENTION

The present invention relates to a nonvolatile semiconductor memory device including a nonvolatile memory element controlled by a word gate and a select gate.

As an example of a nonvolatile semiconductor memory device, a MONOS (Metal-Oxide-Nitride-Oxide-Semiconductor or -Substrate) nonvolatile semiconductor memory device is known. In the MONOS nonvolatile semiconductor memory device, a gate insulating film between a channel and a gate is formed of a laminate consisting of a silicon oxide film, a silicon nitride film, and a silicon oxide film, and a charge is stored in the silicon nitride film.

As the MONOS nonvolatile semiconductor memory device, a MONOS flash memory cell including a nonvolatile memory element (MONOS memory element) controlled by one select gate and one control gate is disclosed (see Japanese Patent Application Laid-open No. 6-181319, Japanese Patent Application Laid-open No. 11-74389, U.S. Pat. No. 5,408,115, and U.S. Pat. No. 5,969,383, for example).

BRIEF SUMMARY OF THE INVENTION

The present invention may provide a nonvolatile semiconductor memory device having a small layout area.

A nonvolatile semiconductor memory device according to the present invention includes:

a memory cell array in which a plurality of memory cells are arranged in a row direction and a column direction, wherein the memory cell array includes a plurality of element isolation regions, wherein each of the memory cells includes a first impurity layer, a second impurity layer, a channel region located between the first impurity layer and the second impurity layer, a word gate and a select gate disposed to face the channel region, and a nonvolatile memory element formed between the word gate and the channel region, and wherein a first wordline connection section, which connects at least one of a plurality of word gate interconnects with at least one of the word gates, is disposed over at least one of the element isolation regions.

The memory cell array may include a plurality of memory blocks. Each of the memory blocks may include the memory cells. An operation of erasing data held in each of the memory cells may be performed at the same time for each of the memory blocks.

The memory cells may include a plurality of word-gate rows, each of the word-gate rows is formed by connecting the word gates in the memory cells arranged in the row direction. The nonvolatile semiconductor memory device may further include a plurality of common connection sections, each of the common connection sections connecting two of the word-gate rows adjacent in the column direction over one of the element isolation regions on which the first wordline connection section is disposed.

The first wordline connection section may connect at least one of the word gate interconnects with one of the common connection sections.

Each of the word gates in the memory block may be connected with all of the word gate interconnects in the memory block.

Each of the word gate interconnects may include a first interconnect extending along the row direction, and a second interconnect extending along the column direction. A second wordline connection section, which connects one of the common connection sections with the second interconnect, may be disposed over at least one of the element isolation regions.

The first wordline connection section may include the second wordline connection section.

The memory cell array may include at least one source interconnect and a plurality of first source line connection sections. Each of the first source line connection sections may connect the source interconnect with the first impurity layer.

The memory cell array may include at least one source interconnect and a plurality of first source line connection sections. Each of the first source line connection sections may connect the source interconnect with the second impurity layer.

The source interconnects may include a third interconnect extending along the row direction, and a fourth interconnect extending along the column direction. At least one of the first source line connection sections may include a second source line connection section which connects the third interconnect with the fourth interconnect.

BRIEF DESCRIPTION OF THE SEVERAL VIEWS OF THE DRAWING

FIG. 21 is another cross-sectional view showing a configuration of the memory block according to the second embodiment.

DETAILED DESCRIPTION OF THE EMBODIMENT

1. First Embodiment

A first embodiment of the present invention is described below with reference to the drawings.

Figure 1:
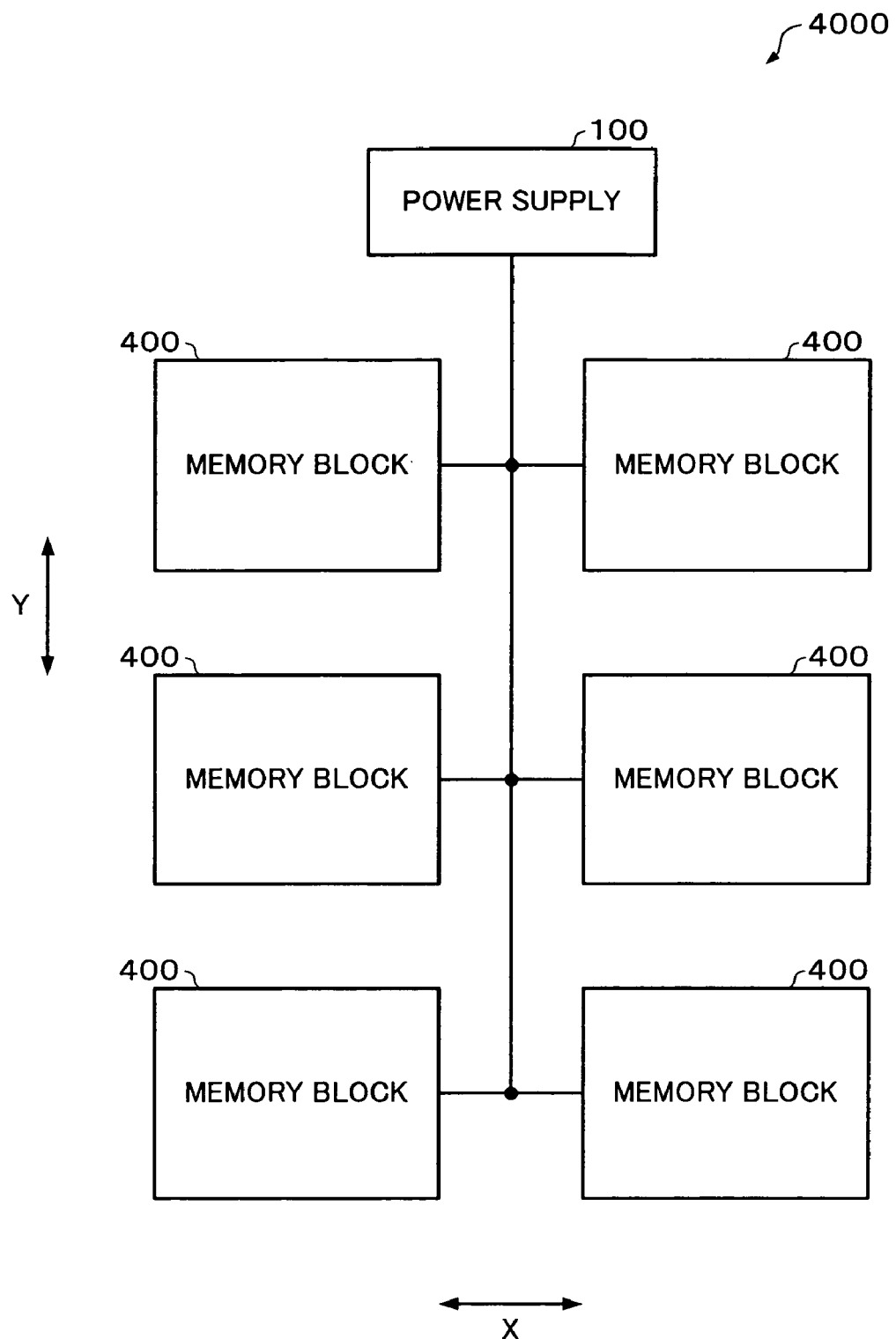
FIG. 1 is an overall diagram according to an embodiment of the present invention.

FIG. 1 is a block diagram showing the entire configuration of the present embodiment. A memory cell array 4000 includes a plurality of memory cells 410 (illustrated later) arranged along a row direction X and a column direction Y. The memory cell array 4000 includes a plurality of memory blocks 400. Each of the memory blocks 400 includes a plurality of memory cells 410 (illustrated later). A plurality of types of voltages are generated by a power supply circuit 100. The voltages generated by the power supply circuit 100 are supplied to the memory blocks 400 through a plurality of voltage supply lines. The memory cell array 4000 includes a bitline driver section (not shown) which drives bitlines 60 (illustrated later) in the memory cell array 4000.

Figure 2:
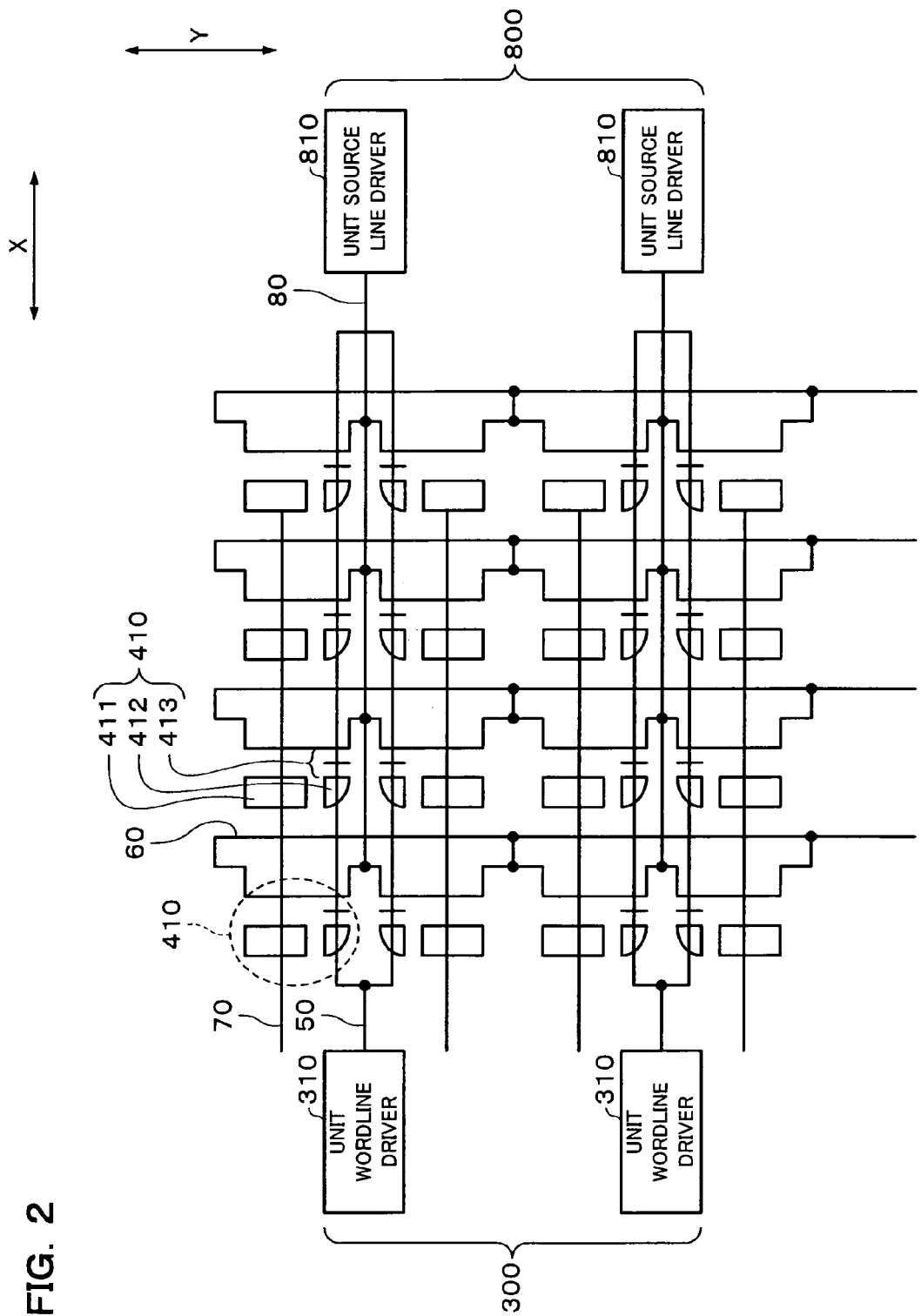
FIG. 2 is a configuration diagram of a memory block according to a first embodiment of the present invention.

FIG. 2 is a circuit diagram showing a part of the memory block 400. The memory block 400 includes a plurality of wordlines 50, a plurality of bitlines 60, a plurality of select lines 70, a plurality of source lines 80, and a plurality of memory cells 410. The memory block 400 also includes a wordline driver section 300, a select line driver section (not shown), and a source line driver section 800. In FIG. 2, the area encircled by a dotted line indicates one memory cell 410.

The memory cell 410 includes a select gate 411, a word gate 412, and an ONO film 413. The structure of the memory cell 410 is described later in detail.

The wordline driver section 300 includes a plurality of unit wordline driver sections 310. The wordline 50 connects in common the word gates 412 of the memory cells 410 disposed in the memory block 400 along the row direction X.

The select line driver section (not shown) drives all the select lines 70 in the memory block 400. The select line 70 connects in common the select gates 411 of the memory cells 410 disposed in the memory block 400 along the row direction X.

The source line driver section 800 includes a plurality of unit source line driver sections 810. The source line 80 connects in common first impurity layers (hereinafter called "wordline side impurity layers WLD") of the memory cells 410 disposed in the memory block 400 along the row direction X. The bitline 60 connects in common second impurity layers (hereinafter called "select gate side impurity layers SGD") of the memory cells 410 in the column direction Y.

Figure 3:
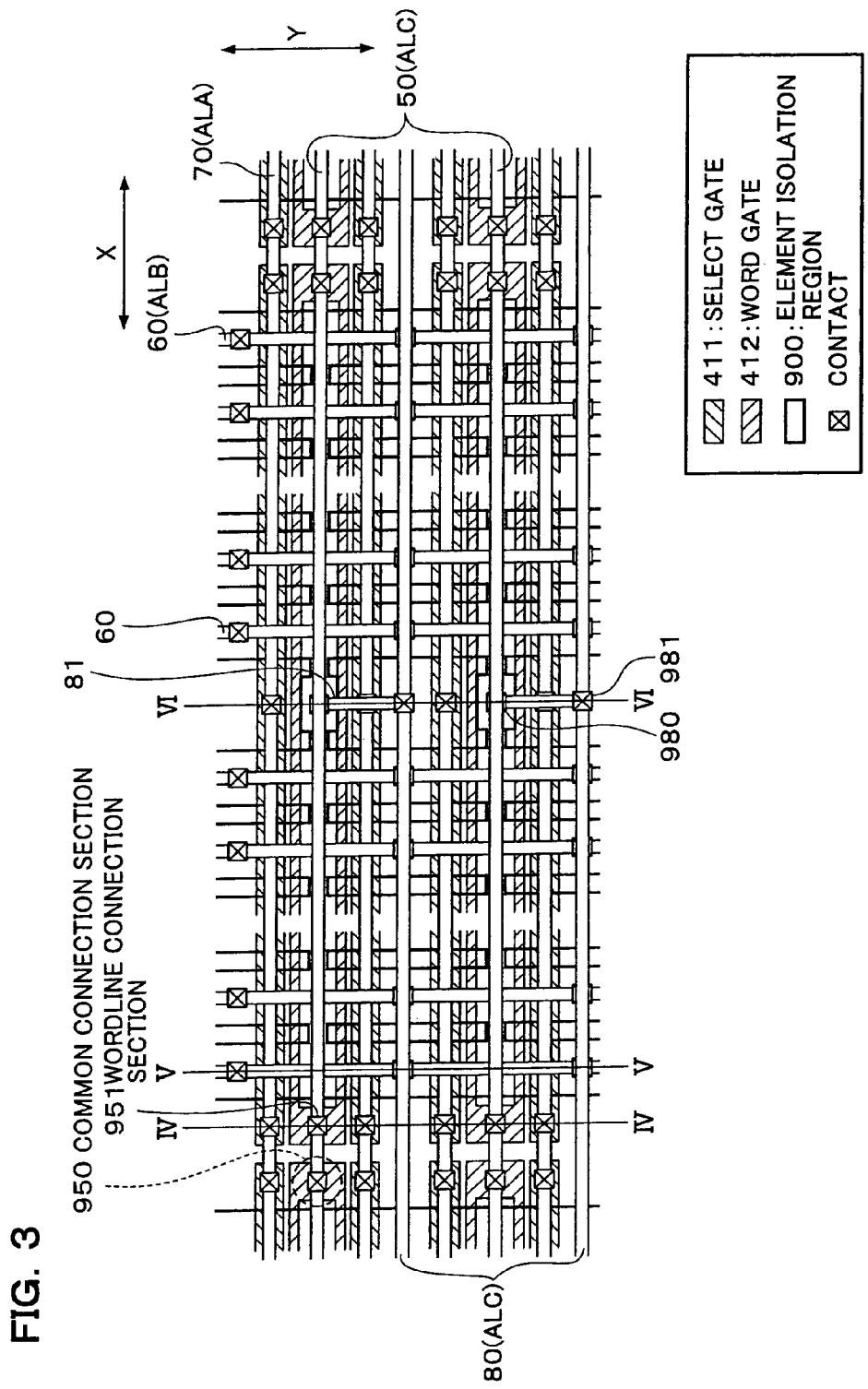
FIG. 3 is a plan view showing a configuration of the memory block according to the first embodiment.

FIG. 3 is a plan view schematically showing the connection relationship and the positional relationship between each layer in a part of the memory block 400. A numeral 900 indicates an element isolation region (shallow-trench-isolation (STI), for example), and a symbol CONT indicates a contact. Among the contacts CONT, a numeral 951 indicates a first wordline connection section, a numeral 980 indicates a first source line connection section, and a numeral 981 indicates a second source line connection section. A symbol ALA indicates a first interconnect layer, a symbol ALB indicates a second interconnect layer, and a symbol ALC indicates a third interconnect layer. The first interconnect layer among the interconnect layers ALA to ALC is the lowermost interconnect layer closest to the substrate.

The bitlines 60 are disposed in the second interconnect layer ALB along the column direction Y. A plurality of source interconnects (source lines 80) and select lines 70 are disposed along the row direction X. The source lines 80 are disposed in the third interconnect layer ALC. The select line 70 is disposed in the first interconnect layer ALA so as to connect in common the select gates 411 in the row direction X. A plurality of fourth interconnects (source interconnects 81) are disposed in the second interconnect layer ALB on the element isolation region 900 along the column direction Y. The source interconnect 81 connects the source line 80 with the wordline side impurity layer WLD (illustrated later). A plurality of first interconnects which are word gate interconnects (hereinafter called "wordlines 50") are disposed in the third interconnect layer ALC in an upper layer of the word gates 412 disposed along the row direction X. The area encircled by a dotted line indicates a common connection section 950 which connects two adjacent word gates 412.

In FIG. 3, the contact CONT for the word gate 412 (first wordline connection section 951) is disposed in the common connection section 950 on the element isolation region 900. Specifically, the contact CONT for the word gate 412 is disposed on the element isolation region 900, and connects the word gate interconnect 50 with the word gate 412. A symbol IV—IV a symbol V—V, and a symbol VI—VI indicate cutting positions for cross-sectional views described below. In the drawings, sections indicated by the same symbols have the same meanings.

Figure 4:
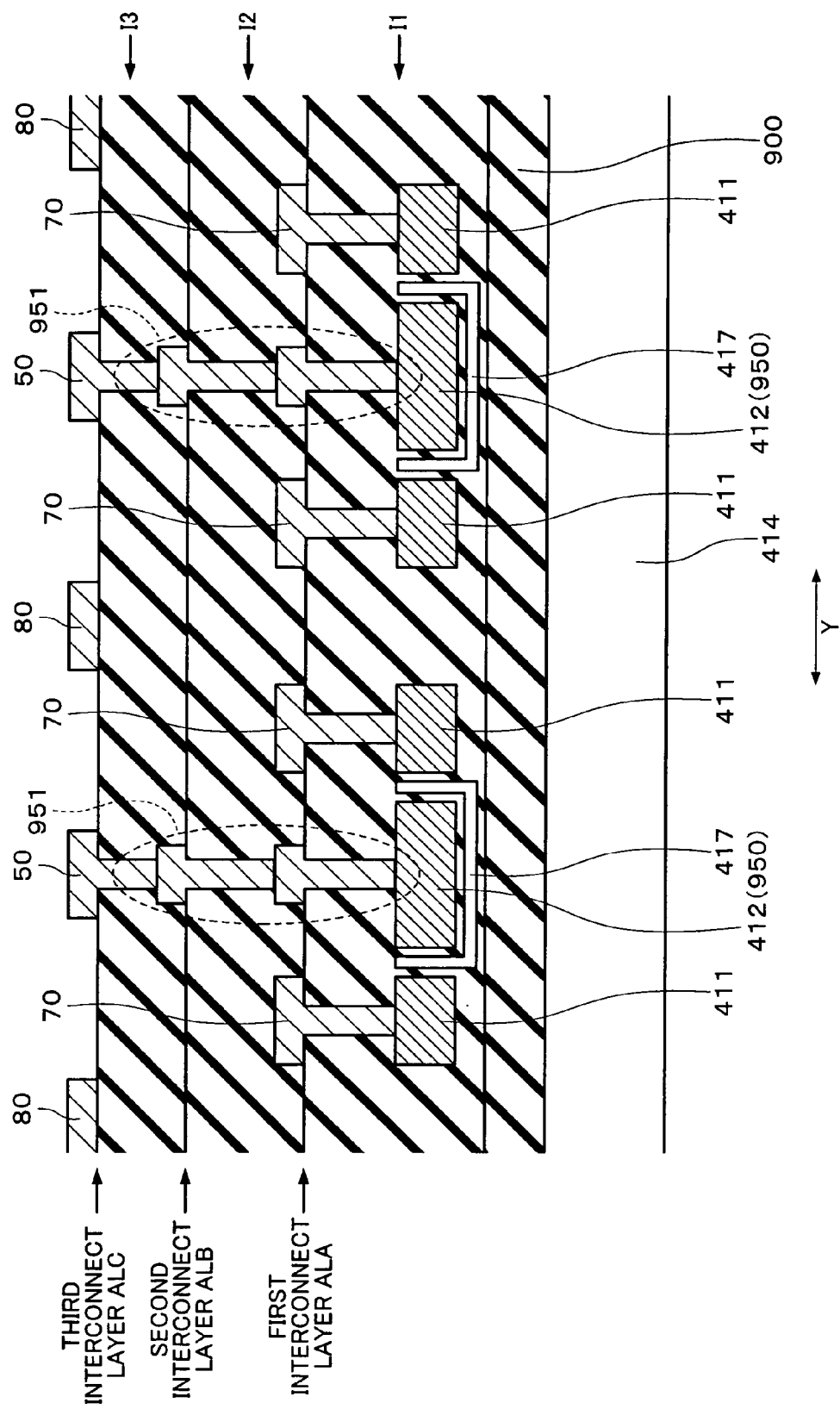
FIG. 4 is a cross-sectional view showing a configuration of the memory block according to the first embodiment.
Figure 5:
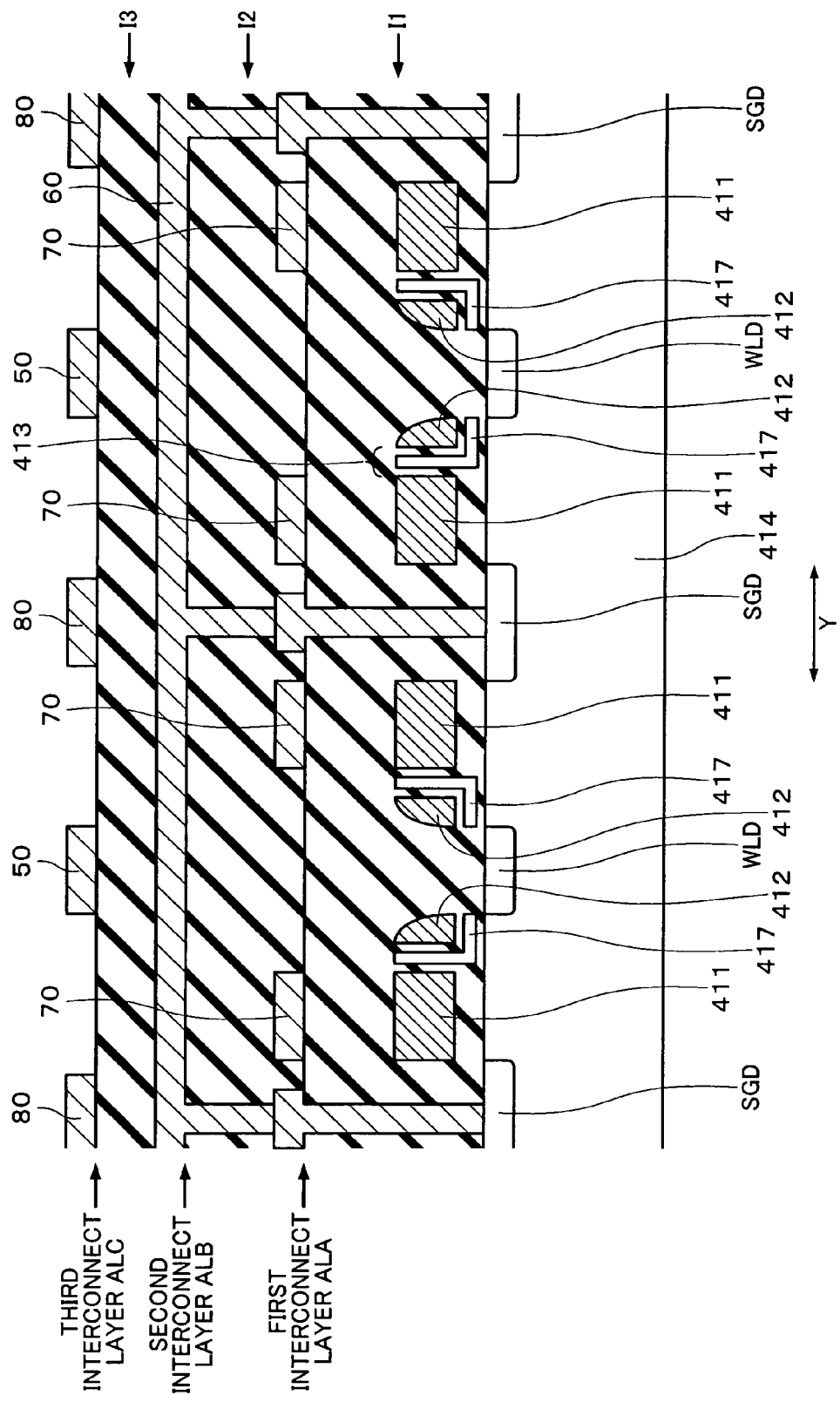
FIG. 5 is another cross-sectional view showing a configuration of the memory block according to the first embodiment.
Figure 6:
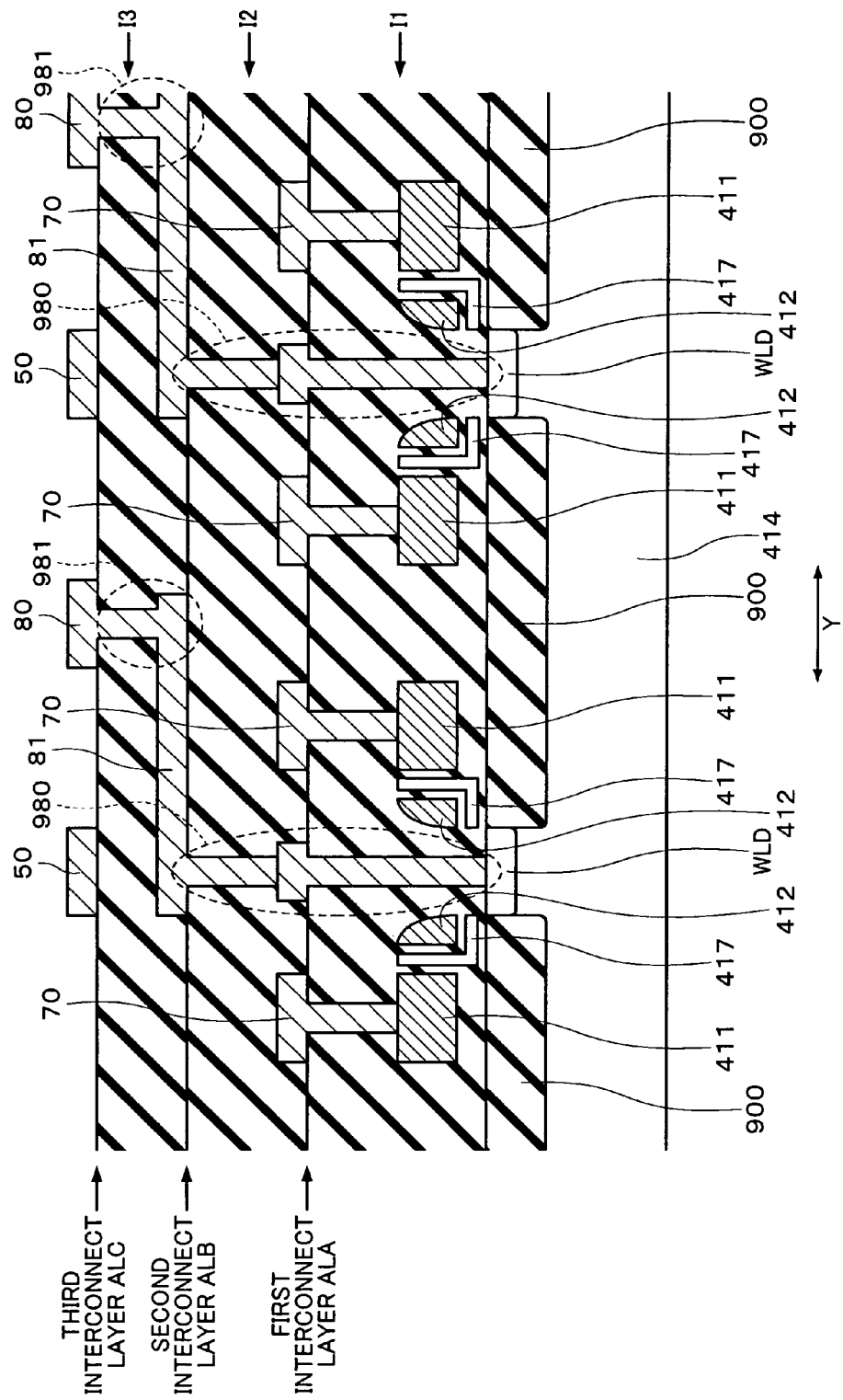
FIG. 6 is another cross-sectional view showing a configuration of the memory block according to the first embodiment.

FIGS. 4 to 6 show the section IV—IV, the section V—V, and the section VI—VI, respectively, in FIG. 3.

The section IV—IV is described below with reference to FIG. 4. The widthwise direction in FIG. 4 is the column direction Y. A numeral 414 indicates a substrate. A symbol I1 indicates a first insulating layer, a symbol I2 indicates a second insulating layer, and a symbol I3 indicates a third insulating layer. The select gate 411 and the word gate 412 are disposed on the element isolation region 900. An insulator film ($SiO_2$, for example) is disposed between the select gate 411 and the element isolation region 900. A nitride film 417 (SiN, for example) is formed between the word gate 412 and the element isolation region 900. The select gate 411 is formed of a conductor (polysilicon, for example).

The select lines 70 are formed in the first interconnect layer ALA. The select line 70 is connected with the select gate 411 covered with the first insulating layer I1 in the lower layer directly under the select line 70 through the contact CONT (connection section which connects the first interconnect layer ALA with the select gate 411). The wordlines 50 and the source lines 80 are formed in the third interconnect layer ALC. The wordline 50 is connected with the common connection section 950 (word gate 412) covered with the first insulating layer I1 through the wordline connection section (first wordline connection section 951). Since the element isolation region 900 is formed in the substrate 414, a channel region is not formed. In the drawings, sections indicated by the same symbols have the same meanings.

The section V—V is described below with reference to FIG. 5. The select gate side impurity layers SGD and the wordline side impurity layers WLD are formed in the substrate 414. A channel region is formed between the select gate side impurity layer SGD and the wordline side impurity layer WLD in the substrate 414. The select gate side impurity layer SGD is shared by two memory cells 410 disposed on either side of the select gate side impurity layer SGD in the column direction Y. The wordline side impurity layer WLD is shared by two memory cells 410 disposed on either side of the wordline side impurity layer WLD in the column direction Y. The select gates 411 and the word gates 412 are covered with the first insulating layer I1. A nitride film 417 (SiN, for example) is formed between the word gate 412 and the channel region in the shape of the letter "L" (or inverted L shape). The nitride film 417 and insulator films (SiO$_2$, for example) on either side of the nitride film 417 make up the ONO film 413 as a trap layer. The select lines 70 are formed in the first interconnect layer ALA. One bitline 60 is formed in the second interconnect layer ALB. The bitline 60 may be formed of a conductor (metal, for example). The bitline 60 is connected with the select gate side impurity layers SGD in the substrate 414 through the contacts CONT (connection sections which connect the second interconnect layer ALB with the substrate 414). The wordlines 50 and the source lines 80 are formed in the third interconnect layer ALC.

The section VI—VI is described below with reference to FIG. 6. The element isolation regions 900 and the wordline side impurity layers WLD are formed in the substrate 414. The select gates 411 and the word gates 412 are covered with the first insulating layer I1. The nitride film 417 (SiN, for example) is formed between the word gate 412 and the element isolation region 900 in the shape of the letter "L" (or inverted L shape). The select lines 70 are formed in the first interconnect layer ALA. The select line 70 is connected with the select gate 411 covered with the first insulating layer I1 in the lower layer directly under the select line 70 through the contact (connection section which connects the first interconnect layer ALA with the select gate 411). A plurality of fourth interconnects (source interconnects 81) used to connect the source lines 80 with the wordline side impurity layers WLD are formed in the second interconnect layer ALB. The source interconnect 81 may be formed of a metal, for example. The wordlines 50 and the source lines 80 are formed in the third interconnect layer ALC. The source line 80 is connected with the source interconnect 81 formed in the second interconnect layer ALB through a source line connection section (second source line connection section 981). The source interconnect 81 is connected with the wordline side impurity layer WLD through the source line connection section (first source line connection section 980). Since the element isolation regions 900 are formed in the substrate 414, a channel region is not formed.

The above-described configuration of the memory cell 410 is an example. For example, the nitride film 417 of the memory cell 410 need not be formed to extend between the select gate 411 and the word gate 412. A silicide (not shown) may be formed on the surface of the word gate 412. A Co silicide or Ti silicide may be used as the silicide (not shown), for example. This enables the load resistance of the word gate 412 to be reduced.

The select gate side impurity layer SGD and the wordline side impurity layer WLD may each be replaced by the other, differing from the above-described structure. The configuration in this case is described later.

In the present embodiment, each of the memory cells 410 is accessed in units of the memory blocks 400. Specifically, the memory cell 410 is selected by selecting one memory block 400 and then selecting one memory cell 410. The memory cell 410 selected is called a selected memory cell. The memory block 400 including the selected memory cell is called a selected memory block, and the memory blocks 400 other than the selected memory block are called unselected memory blocks.

The wordline 50 selected from among the wordlines 50 is called a selected wordline, and the wordlines 50 other than the selected wordline are called unselected wordlines. The bitline 60 selected from among the bitlines 60 is called a selected bitline, and the bitlines 60 other than the selected bitline are called unselected bitlines. The select line 70 selected from among the select lines 70 is called a selected select line, and the select lines 70 other than the selected select line are called unselected select lines. The source line 80 selected from among the source lines 80 is called a selected source line, and the source lines 80 other than the selected source line are called unselected source lines.

The wordlines 50, the bitlines 60, the select lines 70, and the source lines 80 in the unselected memory block are set at an unselected memory block voltage (0 V) in all operations. Each operation (standby, read, program, and erase) is described below with reference to FIG. 7. The area encircled by a dotted line and indicated by a symbol SM in FIG. 7 indicates a selected memory cell. A symbol USM and symbols A to D indicate unselected memory cells.

The standby operation is described below. All the wordlines 50 are set at a standby word voltage (0 V). All the bitlines 60 are set at a standby bit voltage (0 V). All the select lines 70 are set at a standby select voltage (0 V). All the source lines 80 are set at a standby source voltage (0 V).

All the memory cells 410 in the memory cell array 4000 (in the selected memory block and the unselected memory blocks) are set at the above-described voltage application state during standby.

The read operation is described below.

Figure 7:
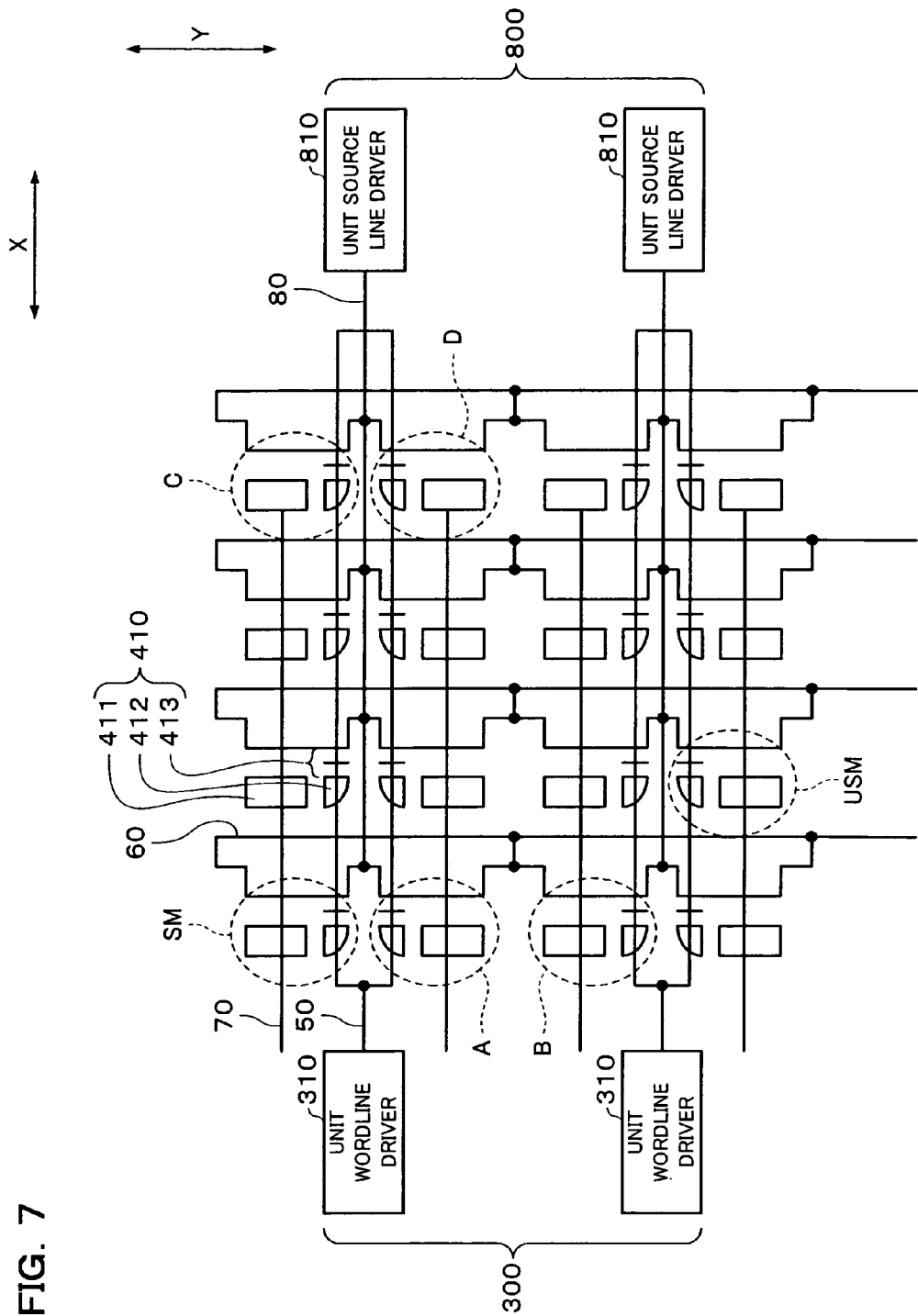
FIG. 7 is another configuration diagram of the memory block according to the first embodiment.

The wordline 50 connected with the selected memory cell SM shown in FIG. 7 (selected wordline) is charged to a read selected word voltage (power supply voltage Vcc). All the unselected wordlines in the selected memory block are set at a read unselected word voltage (0 V). The select line 70 connected with the selected memory cell SM (selected select line) is charged to a read selected select voltage (power supply voltage Vcc). All the unselected select lines in the selected memory block are set at a read unselected select voltage (0 V). The source line 80 connected with the selected memory cell SM (selected source line) is charged to a read selected source voltage (power supply voltage Vcc). All the unselected source lines in the selected memory block are set at a read unselected source voltage (0 V). The bitline 60 connected with the selected memory cell (selected bitline (including the bitline 50 connected with the selected memory cell SM)) is set at a read selected bit voltage (Vcc−Vth). Other bitlines 60, that is, all the unselected bitlines in the selected memory block are set at a read unselected bit voltage (0 V).

The above-described voltage application state causes a channel to be formed in the channel region between the wordline side impurity layer WLD and the select gate side impurity layer SGD of the selected memory cell. Since the word gate 412 of the selected memory cell SM is charged to the read selected word voltage (Vcc), electrons injected into the channel region become hot electrons. Since the select gate 411 of the selected memory cell SM is charged to the read selected select voltage (Vcc), the hot electrons are drawn toward the select gate 411. This allows a current (IDS) to flow through the channel region between the wordline side impurity layer WLD and the select gate side impurity layer SGD on either side of the selected memory cell SM.

Figure 8:
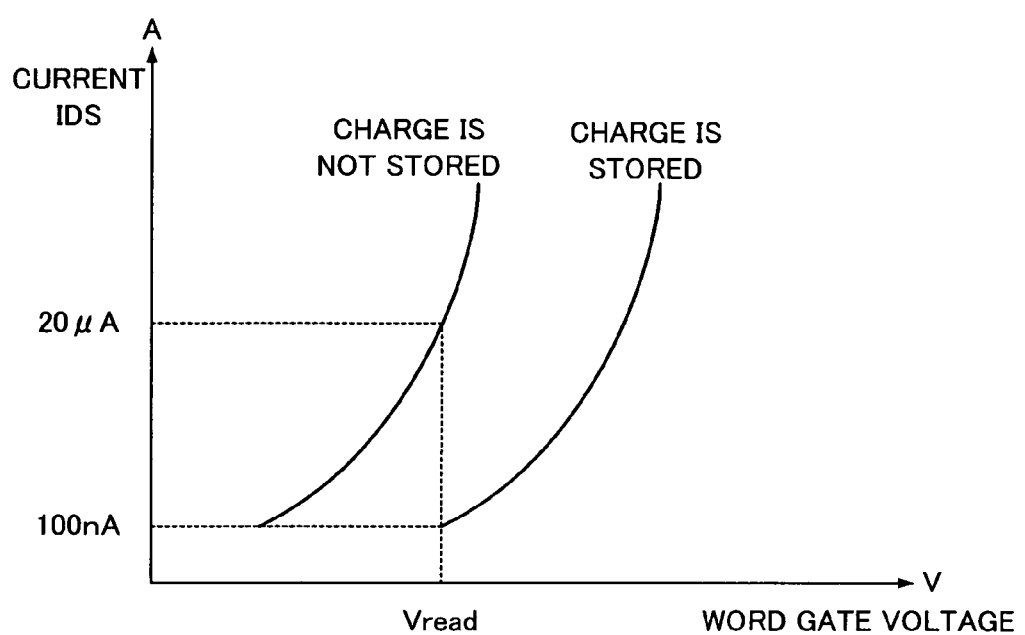
FIG. 8 shows the relationship between the presence or absence of a charge in an ONO film and a current which flows.

The three-region structure consisting of the word gate 412, the ONO film 413, and the channel region of the memory cell 410 may be considered as a MOS transistor. In this case, the threshold value of the transistor becomes higher in a state in which a charge is stored in the ONO film 413 than in a state in which a charge is not stored in the ONO film 413. FIG. 8 shows the correlation between the presence or absence of a charge and a current which flows between the wordline side impurity layer WLD and the select gate side impurity layer SGD.

In FIG. 8, in the case where a voltage Vread is applied to the word gate 412, about 20 μA of current IDS flows when a charge is not stored in the ONO film, and the current IDS flows only to a small extent when a charge is stored in the ONO film. Specifically, since the threshold value of the transistor increases when a charge is stored in the ONO film, the current IDS flows only to a small extent if the voltage applied to the word gate 412 is the voltage Vread.

The data held in the selected memory cell can be read by reading the amount of current using a sense amplifier (not shown) disposed for each bitline 60.

This is the principle of reading data from the selected memory cell. The above-described read operation is a forward read. Specifically, a higher voltage is applied to the wordline side impurity layer WLD than to the select gate side impurity layer SGD in the same manner as in the program operation. A reverse read can also be used as the read method.

Table 1 shows the voltage application state during reading (forward read and reverse read). The unselected memory cell in Table 1 indicates the unselected memory cell USM shown in FIG. 7, and the selected memory cell in Table 1 indicates the selected memory cell SM shown in FIG. 7. A numerical value or Vcc in the cell in Table 1 indicates a voltage value. A symbol WL indicates the wordline 50, and a symbol SG indicates the select line 70. A symbol SL indicates the source line 80, and a symbol BL indicates the bitline 60. In the following description, sections indicated by the same symbols as in Table 1 have the same meanings as in Table 1.

TABLE 1

| | | Selected memory block | | |
| --- | --- | --- | --- | --- |
| | | Unselected memory cell | Selected memory cell | Unselected memory block |
| Forward read | WL | 0 V | Vcc | 0 V |
| | SG | 0 V | Vcc | 0 V |
| | SL | | Vcc | 0 V |
| | BL | 0 V | Vcc − Vth | 0 V |
| Reverse read | WL | 0 V | Vcc | 0 V |

TABLE 1-continued

| | | Selected memory block | | |
| --- | --- | --- | --- | --- |
| | | Unselected memory cell | Selected memory cell | Unselected memory block |
| read | SG | 0 V | Vcc | 0 V |
| | SL | | 0 V | 0 V |
| | BL | 0 V | Vsa | 0 V |

The unselected block shown in Table 1 is in the same state as the standby state. The unselected block is also in the same state as the standby state during programming and erasing.

The unselected memory cells can be classified into five types including the unselected memory cell USM corresponding to the voltage application state. The remaining four types are the unselected memory cells A to D. The selected wordline, the selected bitline, the unselected select line, and the selected source line are connected with the unselected memory cell A shown in FIG. 7. The unselected wordline, the selected bitline, the unselected select line, and the selected source line are connected with the unselected memory cell B shown in FIG. 7. The selected wordline, the unselected bitline, the selected select line, and the selected source line are connected with the unselected memory cell C shown in FIG. 7. The selected wordline, the unselected bitline, the unselected select line, and the selected source line are connected with the unselected memory cell D shown in FIG. 7. Table 2 shows the voltage application states of the unselected memory cells A to D.

TABLE 2

| | | Unselected memory cell A | Unselected memory cell B | Unselected memory cell C | Unselected memory cell D |
| --- | --- | --- | --- | --- | --- |
| Forward read | WL | Vcc | 0 V | Vcc | Vcc |
| | SG | 0 V | 0 V | Vcc | 0 V |
| | SL | Vcc | Vcc | Vcc | Vcc |
| | BL | Vcc − Vth | Vcc − Vth | Vcc | Vcc |
| Reverse read | WL | Vcc | 0 V | Vcc | Vcc |
| | SG | 0 V | 0 V | Vcc | 0 V |
| | SL | 0 V | 0 V | 0 V | 0 V |
| | BL | Vsa | Vsa | 0 V | 0 V |

In view of the above-described principle, the selected wordline, the selected bitline, the selected select line, and the selected source line must be connected with the selected memory cell. If at least one of the unselected lines (unselected wordline, unselected bitline, unselected select line, and unselected source line) is connected with the memory cell 410, this memory cell 410 is an unselected memory cell.

The program operation is described below.

The wordline 50 connected with the selected memory cell SM (selected wordline) is charged to a program selected word voltage (5.5 V). All the unselected wordlines in the selected memory block are set at a program unselected word voltage (0 V). The select line 70 connected with the selected memory cell SM (selected select line) is charged to a program selected select voltage (1 V), and all the unselected select lines are set at a program unselected select voltage (0 V). The source line 80 connected with the selected memory cell SM (selected source line) is charged to a program selected source voltage (5 V), and all the unselected source lines are set at a program unselected source voltage (0 V). The bitline 60 connected with the selected memory cell SM (selected bitline) is charged to a program selected bit voltage (0 V), and all the unselected bitlines in the selected memory block are set at a program unselected bit voltage (Vcc).

The above-described voltage application state causes a channel to be formed in the channel region between the wordline side impurity layer WLD and the select gate side impurity layer SGD of the selected memory cell. Since the select gate 411 of the selected memory cell SM is charged to the program selected select voltage (1 V), electrons injected into the channel region become hot electrons. Since the word gate 412 of the selected memory cell is charged to the program selected word voltage (5.5 V), the hot electrons are drawn toward the word gate 412. The hot electrons drawn toward the word gate 412 are stored in the ONO film 413. The above-described voltage application state is a state in the case of writing data "0" into the selected memory cell SM. In the case of writing data "1" into the selected memory cell SM, a "1" program selected bit voltage (Vcc) is applied to the selected bitline. This is the principle of writing (programming) data into the selected memory cell.

Table 3 shows the voltage application state during programming.

TABLE 3

|  |  | Selected memory block | | Unselected memory block |
|---|---|---|---|---|
|  |  | Unselected memory cell | Selected memory cell |  |
| Program | WL | 0 V | 5.5 V | 0 V |
|  | SG | 0 V | 1 V | 0 V |
|  | SL | 0 V | 5 V | 0 V |
|  | BL | Vcc | 0 V (when writing "0") Vcc (when writing "1") | 0 V |

The unselected memory cell in Table 3 indicates the unselected memory cell USM shown in FIG. 7. The selected memory cell in Table 3 indicates the selected memory cell SM shown in FIG. 7.

There are five types of voltage application states for the unselected memory cells (unselected memory cell USM and unselected memory cells A to D) during the program operation in the same manner as in the read operation (see FIG. 7). Table 4 shows the voltage application states of the unselected memory cells A to D.

TABLE 4

|  |  | Unselected memory cell A | Unselected memory cell B | Unselected memory cell C | Unselected memory cell D |
|---|---|---|---|---|---|
| Program | WL | 5.5 V | 0 V | 5.5 V | 5.5 V |
|  | SG | 0 V | 0 V | 1 V | 0 V |
|  | SL | 5 V | 0 V | 5 V | 5 V |
|  | BL | 0 V (when writing "0") Vcc (when writing "1") | 0 V | Vcc | Vcc |

The erase operation is described below. The erase operation is performed for all the memory cells 410 in the selected memory block. Specifically, all the memory cells 410 in the selected memory block are selected memory cells. All the wordlines 50 in the selected memory block are charged to an erase word voltage (−3 V). All the select lines 70 in the selected memory block are set at an erase select voltage (0 V). All the source lines 80 in the selected memory block are charged to an erase source voltage (5 V). All the bitlines 60 in the selected memory block are set at an erase bit voltage (0 V). An erase substrate voltage (0 V) is applied to the substrate 414 in the selected memory block.

The above-described voltage application state causes a channel to be formed in the channel region between the wordline side impurity layer WLD and the select gate side impurity layer SGD. However, since the word gate 412 of the memory cell 410 in the selected block is charged to the erase word voltage (−3 V), an electric field is generated between the word gate 412 and the select gate side impurity layer SGD. The charge (electrons) which has been stored in the ONO film 413 can be erased by hot holes generated by the application of the electric field.

Table 5 shows the voltage application state during erasing.

TABLE 5

|  |  | Selected memory block | Unselected memory block |
|---|---|---|---|
|  |  | Selected memory cell |  |
| Erase | WL | −3 V | 0 V |
|  | SG | 0 V | 0 V |
|  | SL | 5 V | 0 V |
|  | BL | 0 V | 0 V |

The unselected memory block during the erase operation is in the same voltage application state as the standby state.

In the layout shown in FIG. 3, the contact for the word gate 412 and the contact for the wordline side impurity layer WLD are disposed on the element isolation region 900. This makes it unnecessary to separately provide a region exclusively for disposing the contact, whereby the layout area can be reduced.

1.1 Modification of the First Embodiment

Figure 9:
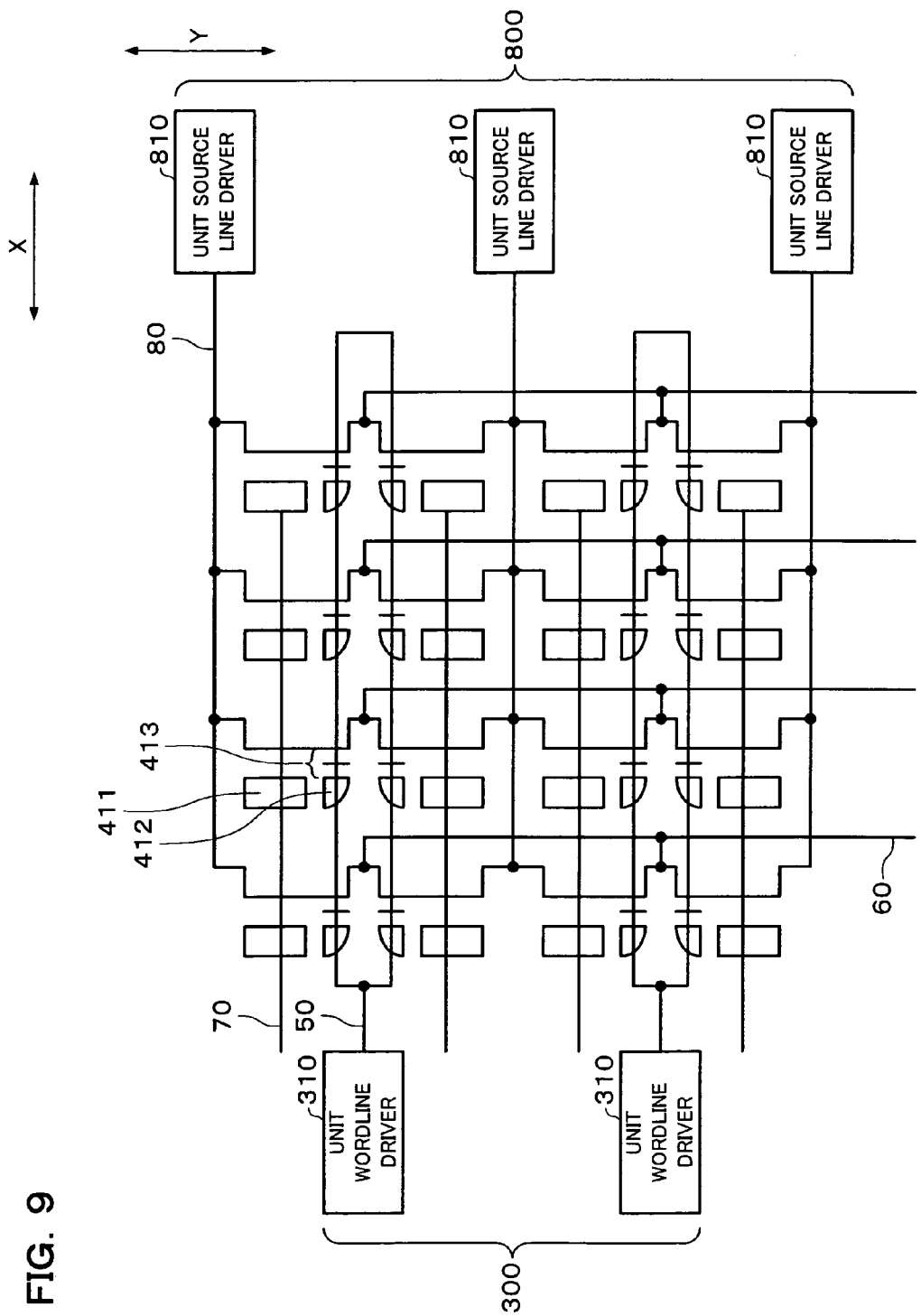
FIG. 9 is a configuration diagram of a memory block according to a modification of the first embodiment.

FIG. 9 is a circuit diagram showing a part of the memory block 400 in a modification of the first embodiment. This modification differs from the first embodiment as to the connection relationship between each memory cell 410 and the bitline 60 and the source line 80. In the present embodiment, the source line 80 connects in common the select gate side impurity layers SGD of the memory cells 410 disposed in the memory block 400 along the row direction X. The bitline 60 connects in common the wordline side impurity layers WLD of the memory cells 410 in the column direction Y. The rest of the configuration of the memory block 400 is the same as the configuration in the first embodiment.

Figure 10:
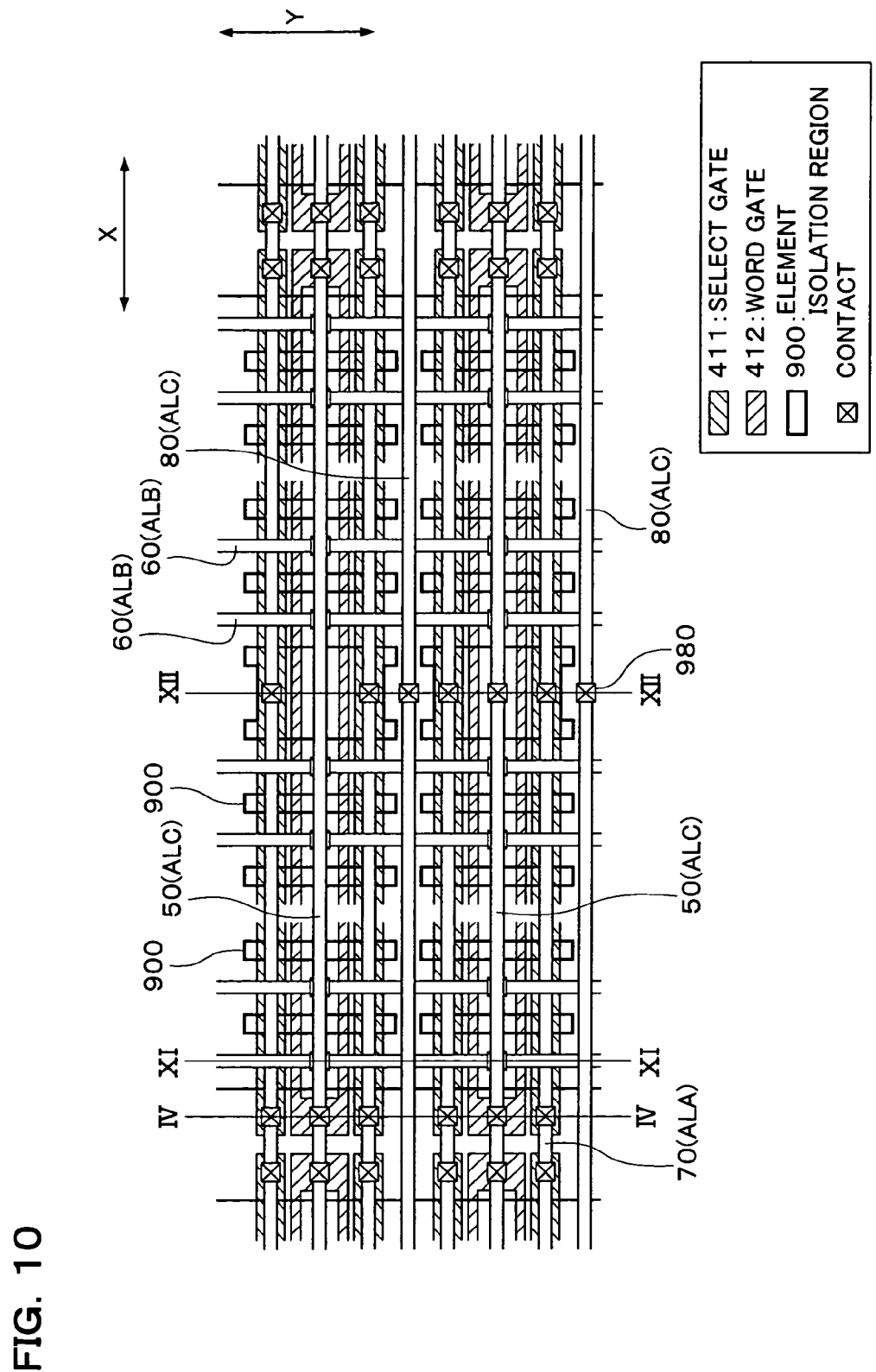
FIG. 10 is a plan view showing a configuration of the memory block according to the modification of the first embodiment.

FIG. 10 is a plan view schematically showing the connection relationship and the positional relationship between each layer in a part of the memory block 400. In FIG. 10, the source line 80 is connected with the select gate side impurity layer SGD in the substrate 414 through the contact CONT (first source line connection section 980). The bitline 60 is connected with the wordline side impurity layer WLD in the substrate 414 through the contact CONT (connection section which connects the second interconnect layer with the substrate 414). A symbol IV—IV, a symbol XI—XI, and a symbol XII—XII shown in FIG. 10 indicate cutting positions for cross-sectional views described below.

Figure 11:
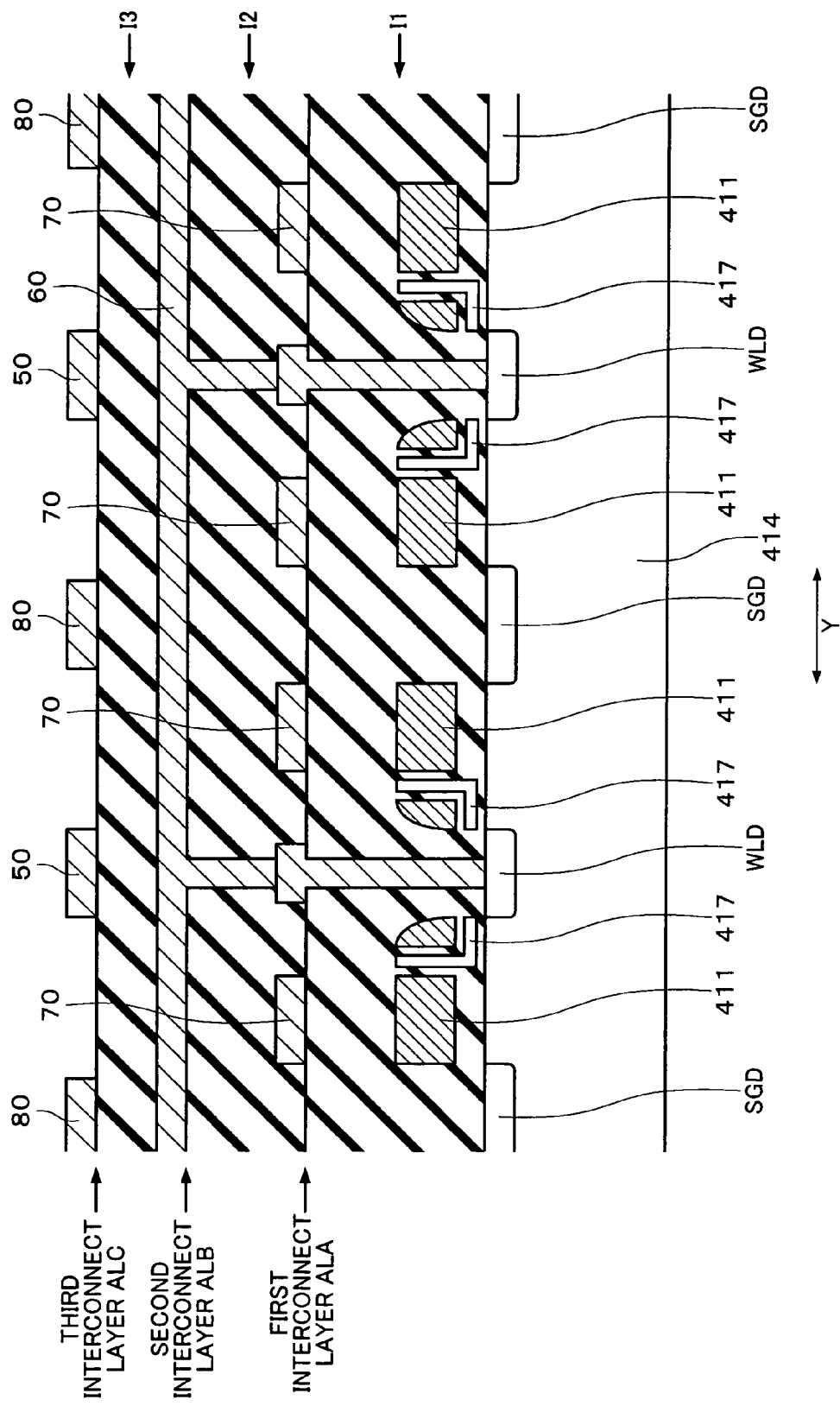
FIG. 11 is a cross-sectional view showing a configuration of the memory block according to the modification of the first embodiment.
Figure 12:
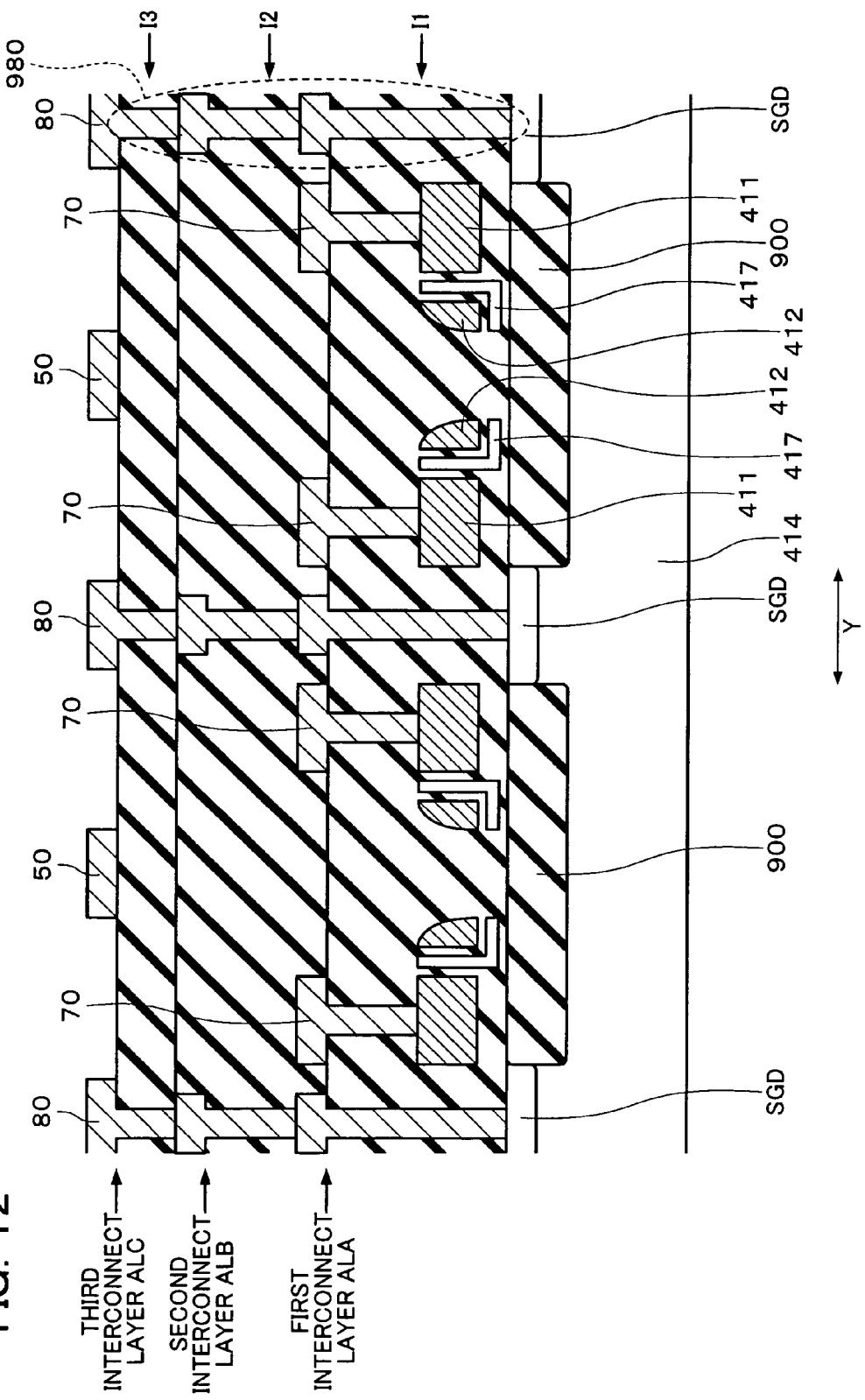
FIG. 12 is another cross-sectional view showing a configuration of the memory block according to the modification of the first embodiment.

FIGS. 11 and 12 show the section XI—XI and the section XII—XII shown in FIG. 10, respectively. The section IV—IV shown in FIG. 10 has the same configuration as the configuration shown in FIG. 4 in the first embodiment (see FIG. 4). Therefore, illustration is omitted.

The section XI—XI is described below with reference to FIG. 11. FIG. 11 differs from FIG. 5 in the first embodiment as to the connection configuration between the bitline 60 in the second interconnect layer ALB and the substrate 414. In the present embodiment, the bitline 60 (second interconnect layer ALB) is connected with the wordline side impurity layer WLD as shown in FIG. 11. The rest of the configuration is the same as the configuration in the first embodiment shown in FIG. 4.

The section XII—XII is described below with reference to FIG. 12. FIG. 12 differs from FIG. 6 in the first embodiment as to the absence of the select gate side impurity layer SGD or the wordline side impurity layer WLD formed in the substrate 414 and the connection configuration between the source line 80 in the third interconnect layer ALC and the substrate 414. As shown in FIG. 12, in the present embodiment, the select gate side impurity layers SGD are formed in the substrate 414, and the wordline side impurity layer WLD is not formed. The source line 80 in the third interconnect layer is connected with the select gate side impurity layer SGD formed in the substrate 414 through the source line connection section (first source line connection section 980).

The ONO film 413 in the present embodiment need not be formed so that the nitride film 417 of the memory cell 410 extends between the select gate 411 and the word gate 412 in the same manner as in the first embodiment. A silicide (not shown) may be formed on the surface of the word gate 412. A Co silicide or Ti silicide may be used as the silicide (not shown), for example. This enables the load resistance of the word gate 412 to be reduced.

The basic operation principle is the same as that in the first embodiment. The present embodiment differs in operation from the first embodiment as to the voltages applied to the bitline 60 and the source line 80. Table 6 shows the voltages applied to each line (wordline 50, bitline 60, select line 70, and source line 80) (operation method) in the present embodiment.

A voltage of 0 V is applied to each line (wordline 50, bitline 60, select line 70, and source line 80) in the unselected memory block in all the operations. Therefore, the voltages applied to the unselected memory block are omitted in Table 6. Table 6 shows the voltages applied to each line (wordline 50, bitline 60, select line 70, and source line 80) in each operation separately for the unselected period and the selected period. In Table 6, the voltage Vcc is applied to the selected wordline selected from among the wordlines 50 during the read operation (forward read). The nonvolatile semiconductor memory device according to the present embodiment is operated according to Table 6.

TABLE 6

| | | Selected memory block | |
|---|---|---|---|
| Forward read | WL | Selected wordline | Vcc |
| | | Unselected wordline | 0 V |
| | SG | Selected select line | Vcc |
| | | Unselected select line | 0 V |
| | BL | Selected bitline | Vsa |
| | | Unselected bitline | 0 V |
| | SL | Selected source line | 0 V |
| | | Unselected source line | 0 V |
| Reverse read | WL | Selected wordline | Vcc |
| | | Unselected wordline | 0 V |
| | SG | Selected select line | Vcc |
| | | Unselected select line | 0 V |
| | BL | Selected bitline | Vcc − Vth |
| | | Unselected bitline | 0 V |
| | SL | Selected source line | Vcc |
| | | Unselected source line | 0 V |
| Program | WL | Selected wordline | 5.5 V |
| | | Unselected wordline | 0 V |
| | SG | Selected select line | 1 V |
| | | Unselected select line | 0 V |

TABLE 6-continued

| | | Selected memory block | |
|---|---|---|---|
| | BL | Selected bitline | 5 V (when writing "0") |
| | | | 0 V (when writing "1") |
| | | Unselected bitline | 0 V |
| | SL | Selected source line | 0 V |
| | | Unselected source line | 0 V |
| Erase | WL | | −3 V |
| | SG | | 0 V |
| | BL | | 5 V |
| | SL | | 0 V |

Either the forward read or the reverse read can be used in the present embodiment in the same manner as in the first embodiment.

2. Second Embodiment

A second embodiment is described below with reference to the drawings.

Figure 13:
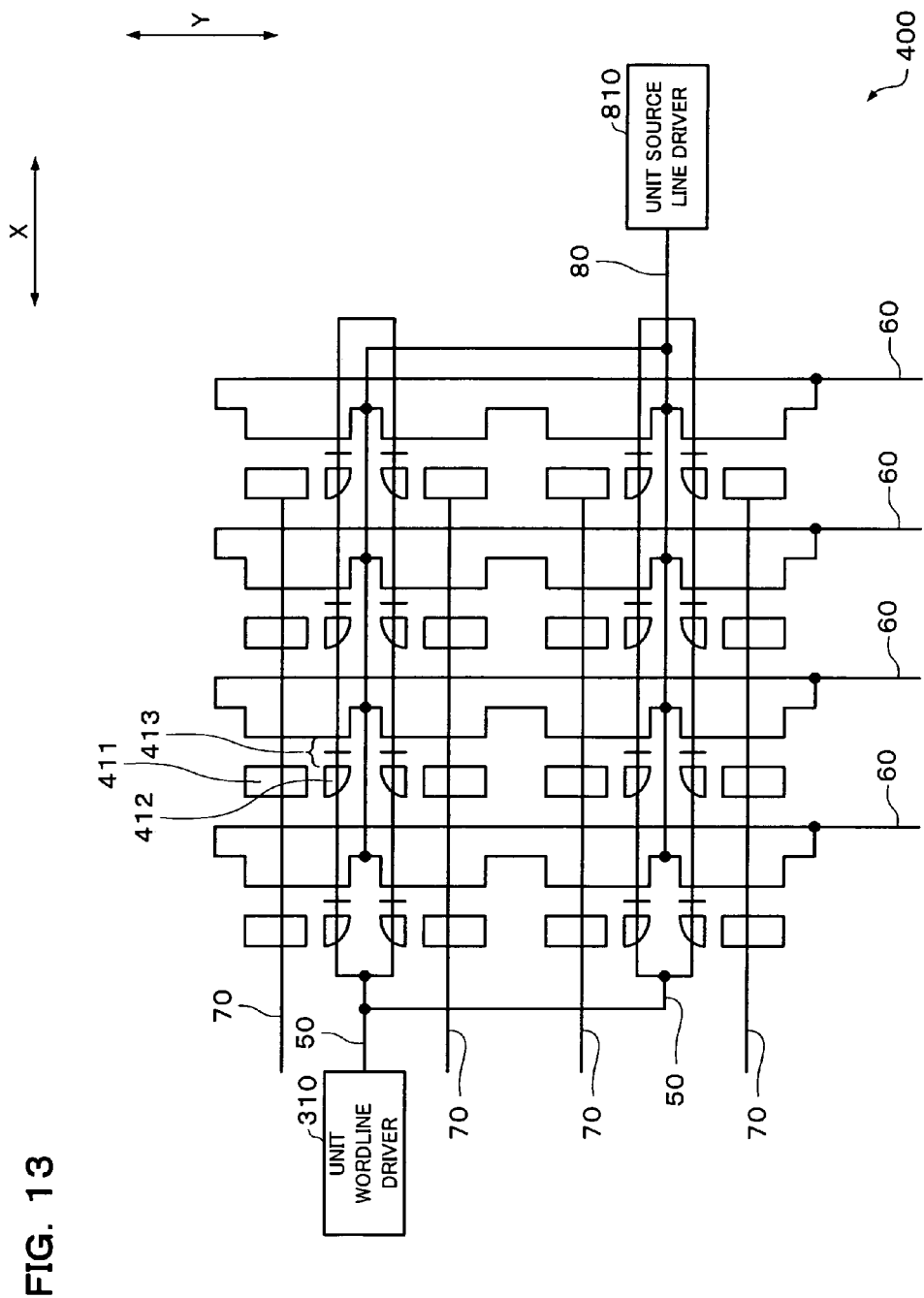
FIG. 13 is a configuration diagram of a memory block according to a second embodiment.

FIG. 13 is a circuit diagram showing a part of the memory block 400 in the present embodiment. The present embodiment differs from the first embodiment in that the wordlines 50 and the source lines 80 are respectively connected in common. In FIG. 13, the wordlines 50 in each memory block 400 are connected in common in the memory block 400. The source lines 80 in each memory block are connected in common in the memory block 400.

The rest of the configuration is the same as the configuration in the first embodiment.

Figure 14:
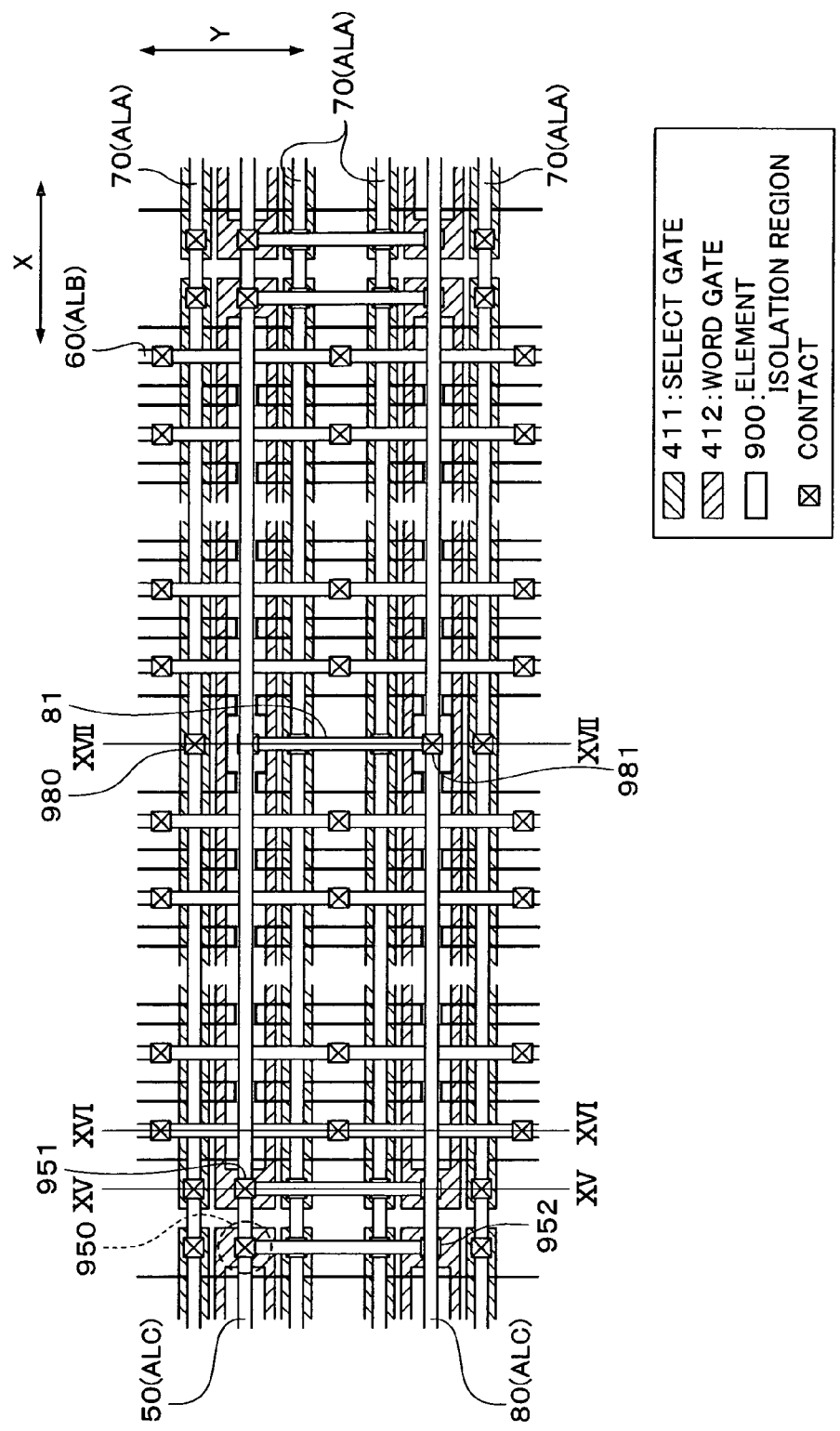
FIG. 14 is a plan view showing a configuration of the memory block according to the second embodiment.

FIG. 14 is a plan view schematically showing the connection relationship and the positional relationship between each layer in a part of the memory block 400. A plurality of first interconnects which are word gate interconnects (hereinafter called "wordlines 50") are disposed in the third interconnect layer ALC in an upper layer of the word gates 412 disposed along the row direction X. The area encircled by a dotted line indicates the common connection section 950 which connects two adjacent word gates 412.

In FIG. 14, a contact CONT for the word gate 412 (first wordline connection section 951 or second wordline connection section 952) is disposed in the common connection section 950 on the element isolation region 900. A plurality of second interconnects which are word gate interconnects (wordline connect lines 51) are disposed in the second interconnect layer ALB along the column direction Y. The wordline connect line 51 connects in common the wordlines 50 in the memory block. Specifically, the contacts CONT for the word gate 412 connect in common the word lines 50 with the word gates 412 on the element isolation region 900.

A plurality of source interconnects (source lines 80) are disposed along the row direction X (one source line 80 is illustrated in FIG. 14). The source line 80 is disposed in the third interconnect layer ALC. A fourth interconnect (source interconnect 81) is disposed in the second interconnect layer ALB on the element isolation region 900 along the column direction Y. The source interconnect 81 connects in common the source lines 80 with the wordline impurity layers WLD (illustrated later). A symbol XV—XV, a symbol XVI—XVI, and a symbol XVII—XVII indicate cutting positions for cross-sectional views described below. In the drawings, sections indicated by the same symbols have the same meanings.

Figure 15:
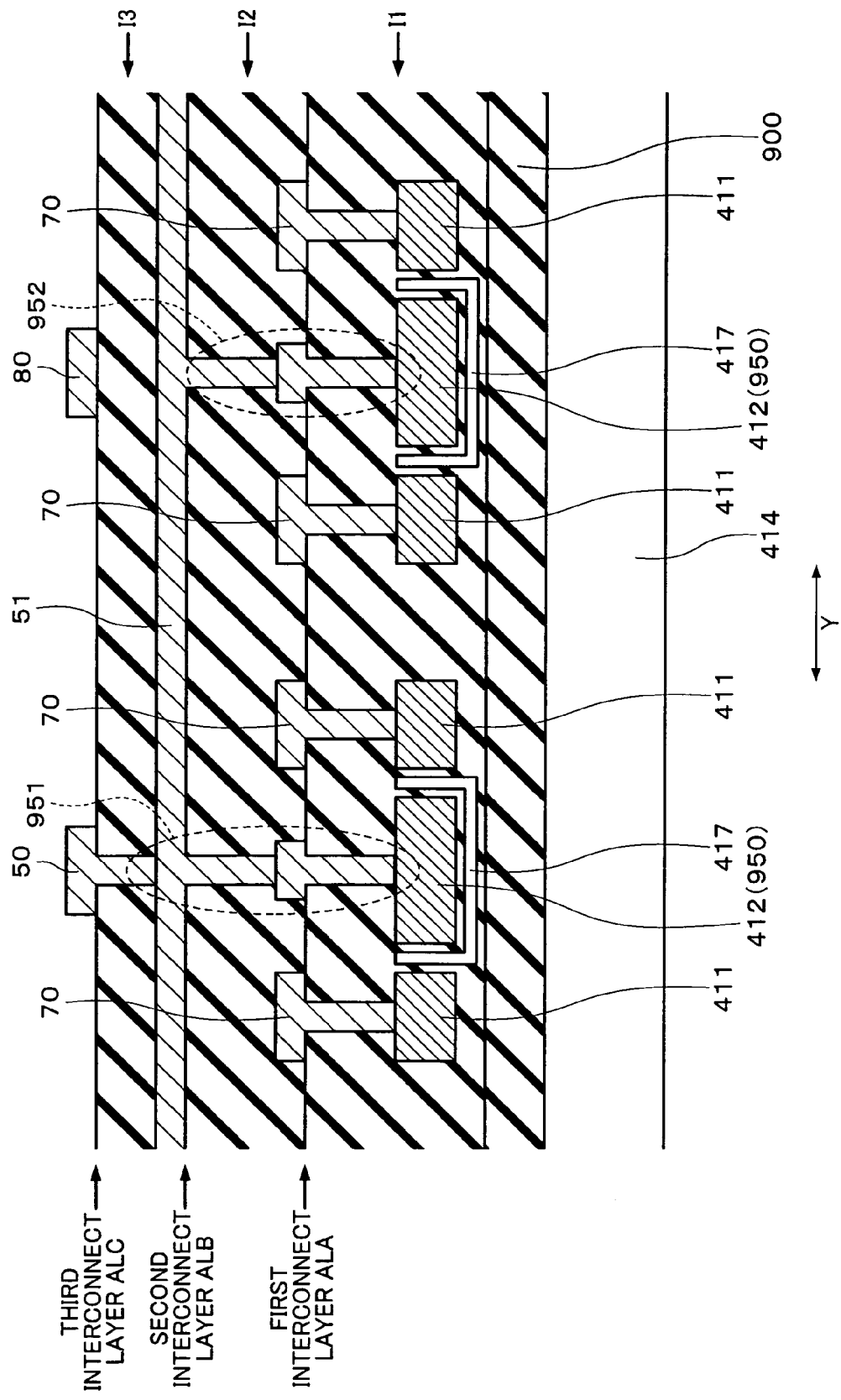
FIG. 15 is a cross-sectional view showing a configuration of the memory block according to the second embodiment.
Figure 16:
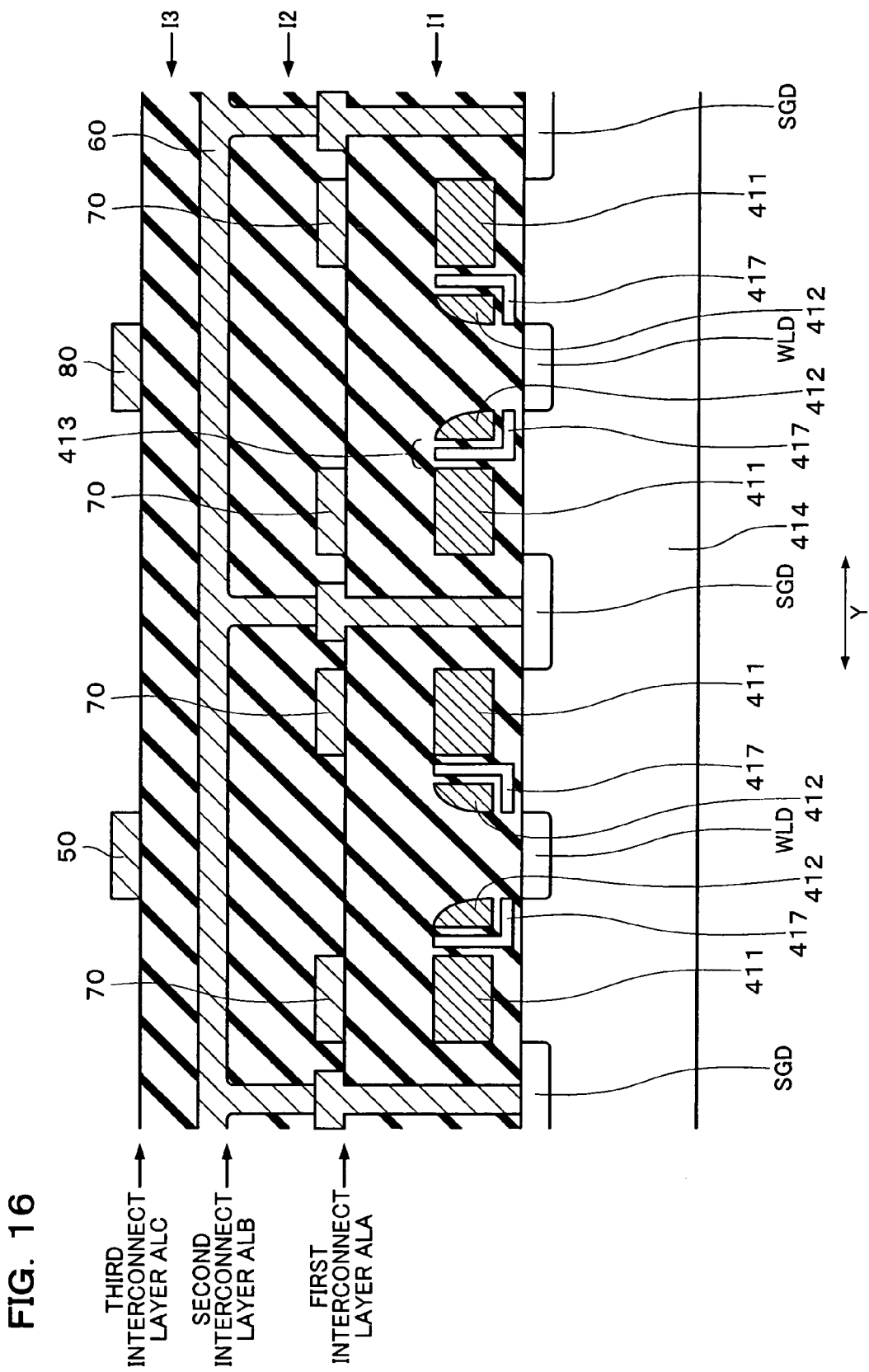
FIG. 16 is another cross-sectional view showing a configuration of the memory block according to the second embodiment.
Figure 17:
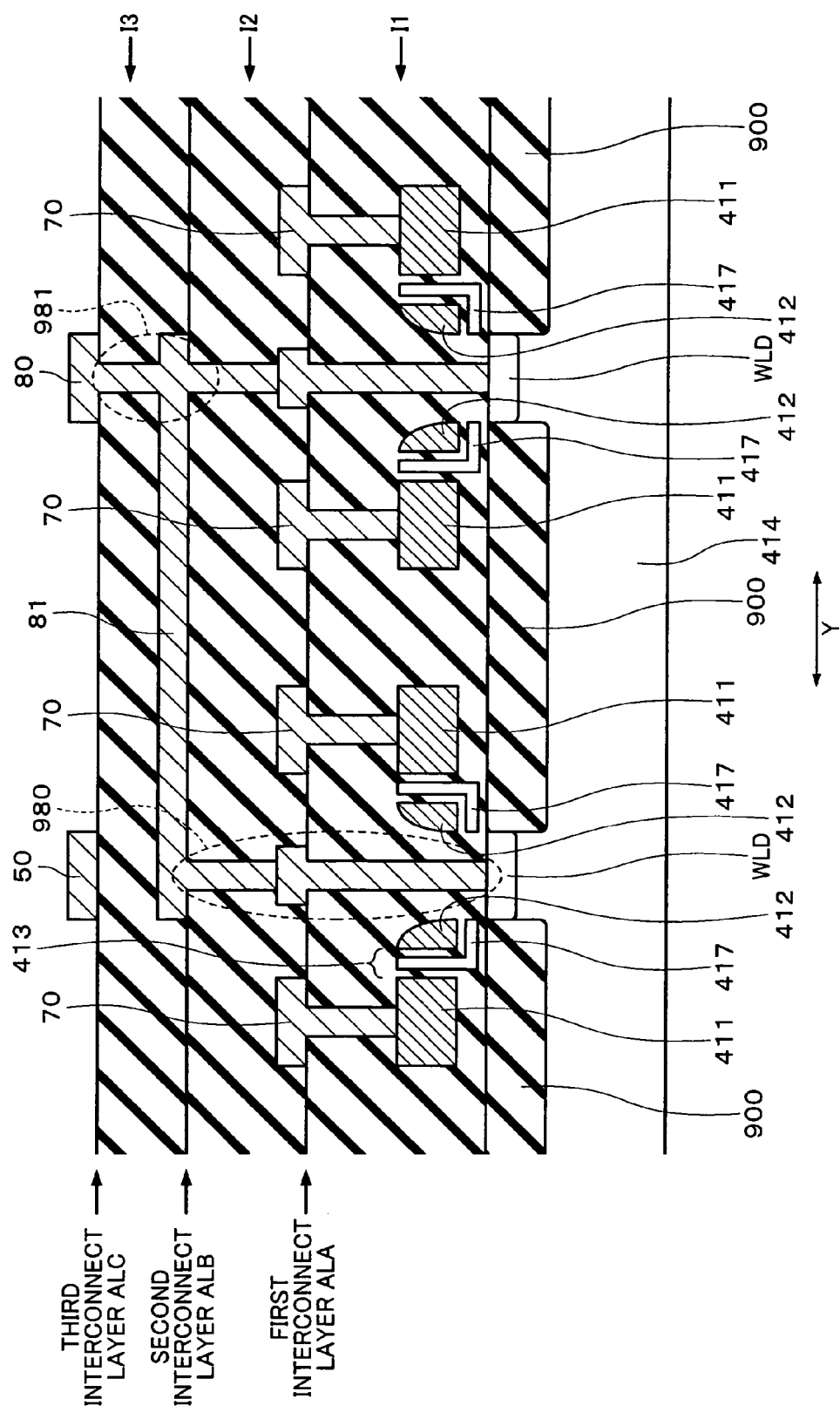
FIG. 17 is yet another cross-sectional view showing a configuration of the memory block according to the second embodiment.

FIGS. 15 to 17 are views respectively showing the section XV—XV, the section XVI—XVI, and the section XVII—XVII in FIG. 14.

The section XV—XV is described below with reference to FIG. 15. The widthwise direction in FIG. 15 is the column direction Y. The select gate 411 and the word gate 412 are disposed on the element isolation region 900. An insulator film (SiO₂, for example) is disposed between the select gate 411 and the element isolation region 900. The insulator film may be formed of a nitride oxide film. The nitride film 417 (SiN, for example) is formed between the word gate 412 and the element isolation region 900. The select gate 411 is formed of a conductor (polysilicon, for example).

The select lines 70 are formed in the first interconnect layer ALA. The select line 70 is connected with the select gate 411 covered with the first insulating layer I1 in the lower layer directly under the select line 70 through the contact CONT (connection section which connects the first interconnect layer ALA with the substrate 414). The wordline 50 and the source line 80 are formed in the third interconnect layer ALC. The wordline 50 is connected with the common connection section 950 through the contact CONT (first wordline connection section 951). This configuration is described below. The wordline 50 is connected with the wordline connect line 51 disposed in the lower layer (second interconnect layer ALB) through the contact CONT (connection section which connects the third interconnect layer ALC with the second interconnect layer ALB). The wordline connect line 51 may be formed of a conductor (metal, for example). The wordline connect line 51 is connected with the common connection section 950 (word gate 412) covered with the first insulating layer I1 through the contact CONT (second wordline connection section 952). This configuration enables the wordline 50 formed in the third interconnect layer ALC to connect in common the word gates 412 in the memory block 400. Since the element isolation region 900 is formed in the substrate 414, a channel region is not formed.

The section XVI—XVI is described below with reference to FIG. 16. The bitline 60 may be formed of a conductor (metal, for example). The select gate side impurity layers SGD and the wordline side impurity layers WLD are formed in the substrate 414. A channel region is formed between the select gate side impurity layer SGD and the wordline side impurity layer WLD in the substrate 414. The select gate side impurity layer SGD is shared by two memory cells 410 disposed on either side of the select gate side impurity layer SGD in the column direction Y. The wordline side impurity layer WLD is shared by two memory cells 410 disposed on either side of the wordline side impurity layer WLD in the column direction Y. The select gates 411 and the word gates 412 are covered with the first insulating layer I1. The nitride film 417 (SiN, for example) is formed between the word gate 412 and the channel region in the shape of the letter "L" (or inverted L shape). The select lines 70 are formed in the first interconnect layer ALA. One bitline 60 is formed in the second interconnect layer ALB. The bitline 60 is connected with the select gate side impurity layers SGD in the substrate 414 through the contacts CONT (connection sections which connect the second interconnect layer ALB with the substrate 414). The wordlines 50 and the source lines 80 are formed in the third interconnect layer ALC.

The section XVII—XVII is described below with reference to FIG. 17. The element isolation regions 900 and the wordline side impurity layers WLD are formed in the substrate 414. The select gates 411 and the word gates 412 are covered with the first insulating layer I1. The nitride film 417 (SiN, for example) is formed between the word gate 412 and the element isolation region 900 in the shape of the letter "L" (or inverted L shape). The select lines 70 are formed in the first interconnect layer ALA. The select line 70 is connected with the select gate 411 covered with the first insulating layer I1 in the lower layer directly under the select line 70 through the contact CONT (connection section which connects the first interconnect layer ALA with the select gate 411). The fourth interconnect (source interconnect 81) used to connect in common the source line 80 (third interconnect layer ALC) with the wordline side impurity layers WLD is formed in the second interconnect layer ALB. The source interconnect 81 may be formed of a metal, for example. The wordline 50 and the source line 80 are formed in the third interconnect layer ALC. The source line 80 is connected with the source interconnect 81 formed in the second interconnect layer ALB through the source line connection section (second source line connection section 981). The source interconnect 81 is connected with the wordline side impurity layers WLD through the source line connection sections (first source line connection sections 980). Since the element isolation regions 900 are formed in the substrate 414, a channel region is not formed.

The above-described configuration of the memory cell 410 is an example. For example, the nitride film 417 of the memory cell 410 need not be formed to extend between the select gate 411 and the word gate 412. A silicide (not shown) may be formed on the surface of the word gate 412. A Co silicide or Ti silicide may be used as the silicide (not shown), for example. This enables the load resistance of the word gate 412 to be reduced.

The basic operation principle is the same as that in the first embodiment. The present embodiment differs in operation from the first embodiment as to the voltages applied to the wordline 50 and the source line 80 in the memory block 400. In the present embodiment, the wordlines 50 in the memory block 400 are connected in common. The source lines 80 in the memory block 400 are connected in common. Therefore, all the wordlines 50 in the selected memory block are selected wordlines and all the source lines 80 in the selected memory block are selected source lines in all the operations in the present embodiment. Table 7 shows the voltages applied to each line (wordline 50, bitline 60, select line 70, and source line 80) (operation method) in the present embodiment.

Table 7 is shown according to the indication method of Table 6. The nonvolatile semiconductor memory device according to the present embodiment is operated according to Table 7.

TABLE 7

| | | Selected memory block | |
|---|---|---|---|
| Forward read | WL | Selected wordline | Vcc |
| | SG | Selected select line | Vcc |
| | | Unselected select line | 0 V |
| | BL | Selected bitline | Vcc − Vth |
| | | Unselected bitline | 0 V |
| | SL | Selected source line | Vcc |
| Reverse read | WL | Selected wordline | Vcc |
| | SG | Selected select line | Vcc |
| | | Unselected select line | 0 V |
| | BL | Selected bitline | Vsa |
| | | Unselected bitline | 0 V |
| | SL | Selected source line | 0 V |
| Program | WL | Selected wordline | 5.5 V |
| | SG | Selected select line | 1 V |
| | | Unselected select line | 0 V |
| | BL | Selected bitline | 0 V (when writing "0") |
| | | | Vcc (when writing "1") |
| | | Unselected bitline | 0 V |

TABLE 7-continued

| | | Selected memory block | |
|---|---|---|---|
| Erase | SL | Selected source line | 5 V |
| | WL | | −3 V |
| | SG | | 0 V |
| | BL | | 0 V |
| | SL | | 5 V |

The unselected memory cells can be classified into three types (unselected memory cells E to G) corresponding to the voltage application state. The unselected memory cell E is an unselected memory cell connected with the selected wordline, the selected bitline, the unselected select line, and the selected source line. The unselected memory cell F is in the present embodiment, unselected memory cell connected with the selected wordline, the unselected bitline, the selected select line, and the selected source line. The unselected memory cell G is in the present embodiment, unselected memory cell connected with the selected wordline, the unselected bitline, the unselected select line, and the selected source line. Either the forward read or the reverse read can be used in the present embodiment.

Table 8 shows the voltage application states of the unselected memory cells E to G during the read operation and the program operation. Since all the memory cells in the selected block are selected memory cells during the erase operation, the voltage application state in the erase operation is not omitted in Table 8.

TABLE 8

| | | Unselected memory cell E | Unselected memory cell F | Unselected memory cell G |
|---|---|---|---|---|
| Forward read | WL | | Vcc | |
| | SG | 0 V | Vcc | 0 V |
| | SL | | 0 V | |
| | BL | Vsa | 0 V | 0 V |
| Reverse read | WL | | Vcc | |
| | SG | 0 V | Vcc | 0 V |
| | SL | | Vcc | |
| | BL | Vcc − Vsa | Vcc | Vcc |
| Program | WL | | 5.5 V | |
| | SG | 0 V | 1 V | 0 V |
| | SL | | 5 V | |
| | BL | 0 V | Vcc | Vcc |

The reason why the unselected memory cells E to G do not malfunction even if the voltages are applied as in the present embodiment is describe below. In order to read or program the data in the ONO film 413 of each memory cell 410, a channel must be formed in the channel region of each memory cell 410, and a current must flow through the channel region. However, a channel is not formed in the unselected memory cells F and G shown in Table 8, since a given potential difference is not formed between the source line 80 and the bitline 60. Specifically, the unselected memory cells F and G are not influenced by the voltage application state of the wordline 50 and the select line 70. In the unselected memory cells E and G shown in Table 8, since the select line 70 is set at 0 V, a current does not flow through the channel region even if the channel is formed. A normal operation can be performed in the present embodiment for the above-described reason.

In the present embodiment, the wordlines 50 are connected in common and the source lines 80 are connected in common in units of the memory blocks 400 (see FIG. 13). Therefore, it suffices to provide one unit wordline driver section 310 and one unit source line driver section 810 in each memory block 400. FIG. 14 shows a layout method in this case. In the layout shown in FIG. 14, since the contacts for connecting in common the wordlines 50 and for connecting in common the source lines 80 are disposed on the element isolation regions 900, the layout area can be reduced. Moreover, since it suffices to dispose one unit wordline driver section 310 and one unit source line driver section 810, the interconnect pitch of the memory block 400 can be reduced. This also reduces the layout area.

2.1 Modification of second embodiment

Figure 18:
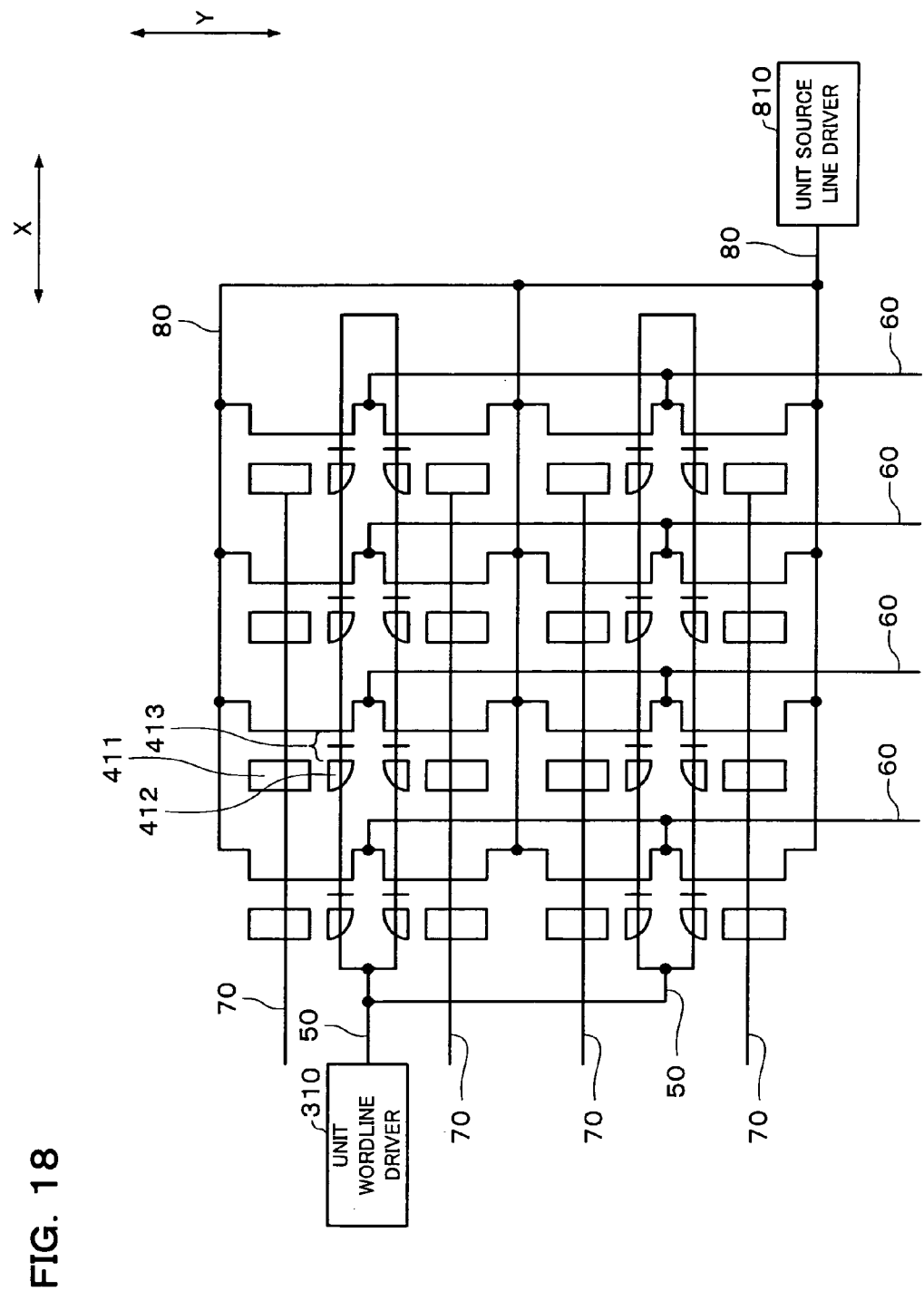
FIG. 18 is a configuration diagram of the memory block according to the second embodiment.

FIG. 18 is a circuit diagram showing a part of the memory block 400 in a modification of the second embodiment. This modification differs from the second embodiment as to the connection relationship between each memory cell 410 and the bitline 60 and the source line 80. In the present embodiment, the source line 80 connects in common the select gate side impurity layers SGD of the memory cells 410 disposed in the memory block 400 along the row direction X. The bitline 60 connects in common the wordline side impurity layers WLD of the memory cells 410 in the column direction Y. The rest of the configuration of the memory block 400 is the same as the configuration in the second embodiment.

Figure 19:
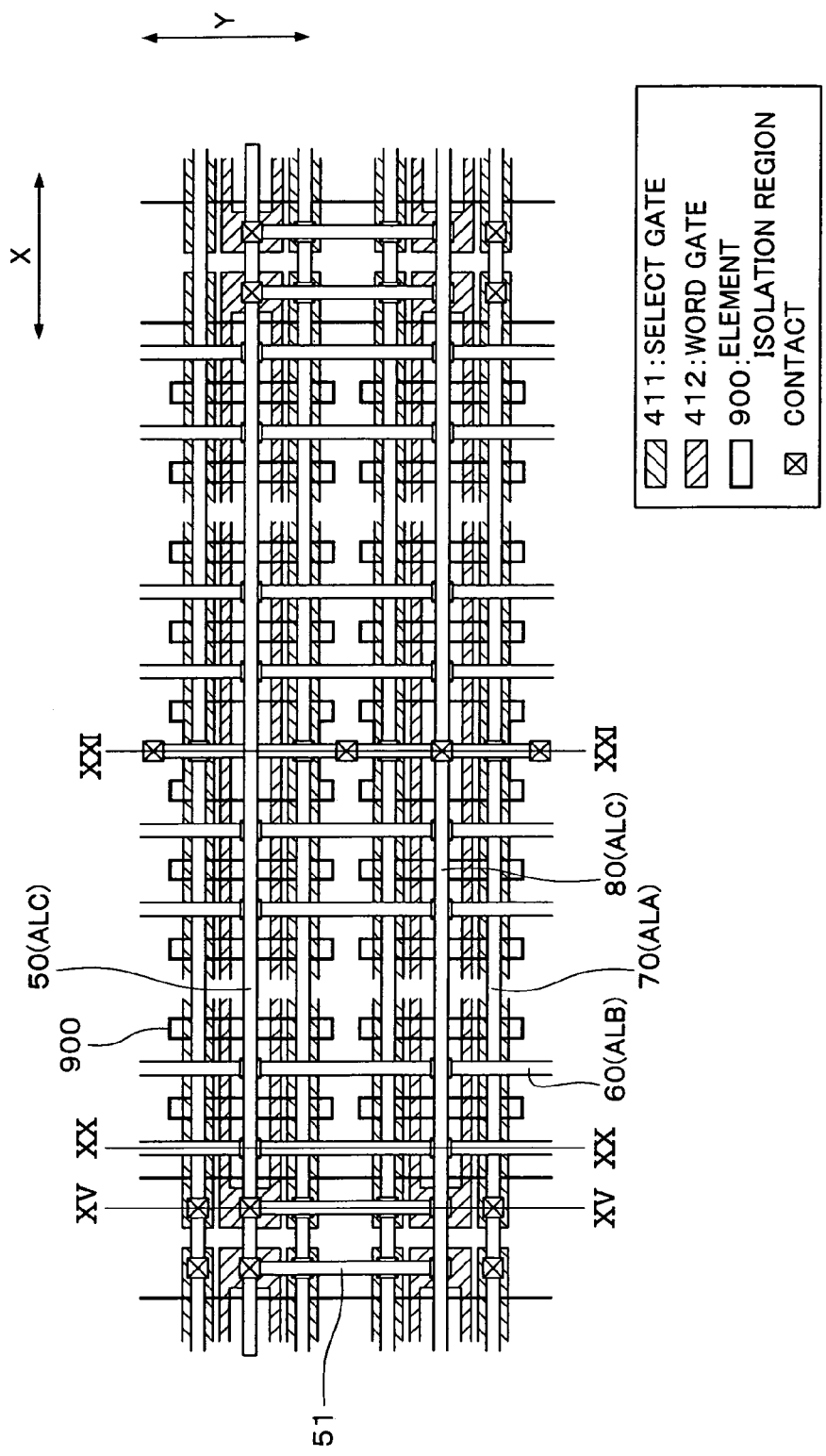
FIG. 19 is a plan view showing a configuration of the memory block according to the second embodiment.

FIG. 19 is a plan view schematically showing the connection relationship and the positional relationship between each layer in a part of the memory block 400. In FIG. 19, the source line 80 (third interconnect layer ALC) is connected with the fourth interconnect (source interconnect 81) disposed in the second interconnect layer ALB along the column direction Y through the source line connection sections (second source line connection sections 981). The source interconnect 81 is connected with the select gate side impurity layers SGD in the substrate 414 through the source line connection sections (first source line connection sections 980). The bitline 60 (second interconnect layer) is connected with the wordline side impurity layers WLD in the substrate 414 through the contacts CONT (connection sections which connect the second interconnect layer with the substrate 414). The rest of the configuration is the same as the configuration in the second embodiment. A symbol XV—XV, a symbol XX—XX, and a symbol XXI—XXI in FIG. 19 indicate cutting positions for cross-sectional views described below.

Figure 20:
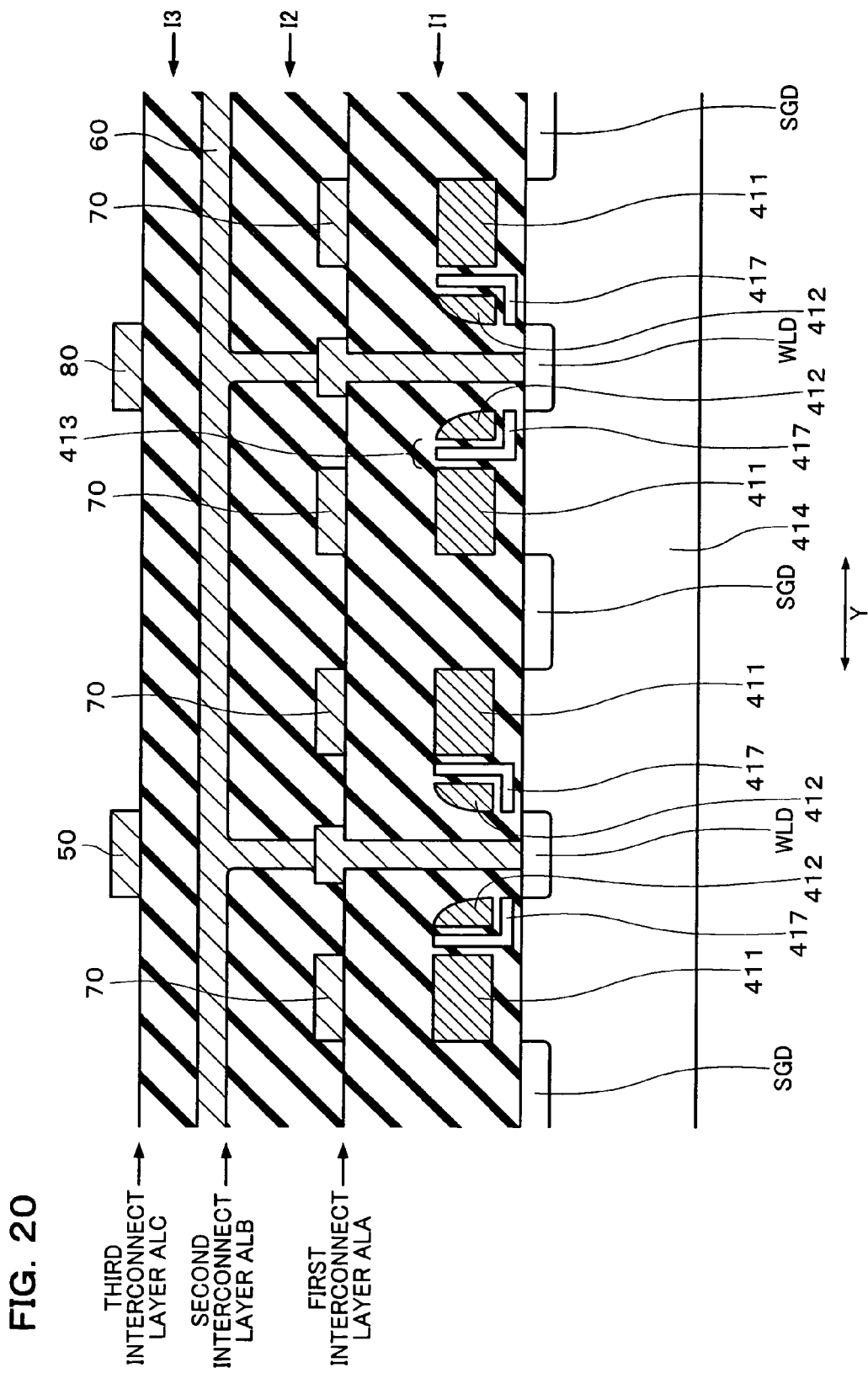
FIG. 20 is a cross-sectional view showing a configuration of the memory block according to the second embodiment.

FIGS. 20 and 21 are views respectively showing the section XX—XX and the section XXI—XXI shown in FIG. 19. The section XV—XV shown in FIG. 19 has the same configuration as the configuration shown in FIG. 15 in the second embodiment (see FIG. 15). Therefore, illustration is omitted.

The section XX—XX is described below with reference to FIG. 20. FIG. 20 differs from FIG. 16 in the second embodiment as to the connection configuration between the bitline 60 in the second interconnect layer ALB and the substrate 414. In the present embodiment, the bitline 60 (second interconnect layer ALB) is connected with the wordline side impurity layers WLD through the contacts CONT (connection sections which connect the second interconnect layer ALB with the substrate 414), as shown in FIG. 20. The rest of the configuration is the same as the configuration shown in FIG. 16 in the second embodiment.

The section XXI—XXI is described below with reference to FIG. 21. FIG. 21 differs from FIG. 17 in the second embodiment as to the absence of the select gate side impurity layer SGD or the wordline side impurity layer WLD formed in the substrate 414 and the connection configuration between the source line 80 in the third interconnect layer ALC and the substrate 414. As shown in FIG. 21, in the present embodiment, the select gate side impurity layers SGD are formed in the substrate 414, and the wordline side impurity layer WLD is not formed. The source line 80 in the third interconnect layer ALC is connected with the select gate side impurity layers SGD formed in the substrate 414. The source line 80 (third interconnect layer ALC) is connected with the source interconnect 81 through the source line connection section (second source line connection section 981). The source interconnect 81 is disposed in the second interconnect layer ALB along the column direction Y. The source interconnect 81 is connected with the select gate side impurity layers SGD formed in the substrate 414 through the source line connection sections (first source line connection sections 980). The source interconnect 81 may be formed of a conductor (metal, for example).

The ONO film 413 in the present embodiment need not be formed so that the nitride film 417 of the memory cell 410 extends between the select gate 411 and the word gate 412 in the same manner as in the second embodiment. A silicide (not shown) may be formed on the surface of the word gate 412. A Co silicide or Ti silicide may be used as the silicide (not shown), for example. This enables the load resistance of the word gate 412 to be reduced.

The basic operation principle is the same as that in the second embodiment. The present embodiment differs in operation from the second embodiment as to the voltages applied to the bitline 60 and the source line 80. Table 6 shows the voltages applied to each line (wordline 50, bitline 60, select line 70, and source line 80) (operation method) in the present embodiment.

The unselected memory block is not shown in Table 9 in all operations for the same reason as in the second embodiment. The nonvolatile semiconductor memory device according to the present embodiment is operated according to Table 9.

TABLE 9

| | | Selected memory block | |
|---|---|---|---|
| Forward read | WL | Selected wordline | Vcc |
| | SG | Selected select line | Vcc |
| | | Unselected select line | 0 V |
| | BL | Selected bitline | Vcc − Vth |
| | | Unselected bitline | 0 V |
| | SL | Selected source line | Vcc |
| Reverse read | WL | Selected wordline | Vcc |
| | SG | Selected select line | Vcc |
| | | Unselected select line | 0 V |
| | BL | Selected bitline | Vsa |
| | | Unselected bitline | 0 V |
| | SL | Selected source line | 0 V |
| Program | WL | Selected wordline | 5.5 V |
| | SG | Selected select line | 1 V |
| | | Unselected select line | 0 V |
| | BL | Selected bitline | 5 V (when writing "0") |
| | | | 0 V (when writing "1") |
| | | Unselected bitline | 0 V |
| | SL | Selected source line | 0 V |
| Erase | WL | | −3 V |
| | SG | | 0 V |
| | BL | | 5 V |
| | SL | | 0 V |

Either the forward read or the reverse read can be used in the present embodiment in the same manner as in the second embodiment.

The present invention can provide a nonvolatile semiconductor memory device having a small layout area as described above.

The present invention is not limited to the above-described embodiments. Various modifications and variations are possible without departing from the spirit and scope of the present invention.

What is claimed is:

1. A nonvolatile semiconductor memory device comprising:
   a memory cell array in which a plurality of memory cells are arranged in a row direction and a column direction, wherein the memory cell array includes a plurality of element isolation regions,
   wherein each of the memory cells includes a first impurity layer, a second impurity layer, a channel region located between the first impurity layer and the second impurity layer, a word gate and a select gate disposed to face the channel region, and a nonvolatile memory element formed between the word gate and the channel region,
   wherein a first wordline connection section, which connects at least one of a plurality of word gate interconnects with at least one of the word gates, is disposed over at least one of the element isolation regions,
   wherein the memory cells include a plurality of word gate rows, each of the word gate rows is formed by connecting the word gates in the memory cells arranged in the row direction, and
   wherein the nonvolatile semiconductor memory device further includes a plurality of common connection sections, each of the common connection sections connecting two of the word gate rows adjacent in the column direction over one of the element isolation regions on which the first wordline connection section is disposed.

2. The nonvolatile semiconductor memory device as defined in claim 1,
   wherein the first wordline connection section connects at least one of the word gate interconnects with one of the common connection sections.

3. The nonvolatile semiconductor memory device as defined in claim 1,
   wherein each of the word gate interconnects includes a first interconnect extending along the row direction, and a second interconnect extending along the column direction, and
   wherein a second wordline connection section, which connects one of the common connection sections with the second interconnect, is disposed over at least one of the element isolation regions.

4. The nonvolatile semiconductor memory device as defined in claim 3,
   wherein the first wordline connection section includes the second wordline connection section.

5. The nonvolatile semiconductor memory device as defined in claim 1,
   wherein the memory cell array includes at least one source interconnect and a plurality of first source line connection sections, and
   wherein each of the first source line connection sections connects the source interconnect with the first impurity layer.

6. The nonvolatile semiconductor memory device as defined in claim 5,
   wherein the source interconnects include a third interconnect extending along the row direction, and a fourth interconnect extending along the column direction, and wherein at least one of the first source line connection sections includes a second source line connection section which connects the third interconnect with the fourth interconnect.

7. The nonvolatile semiconductor memory device as defined in claim 1,
wherein the memory cell array includes at least one source interconnect and a plurality of first source line connection sections, and
wherein each of the first source line connection sections connects the source interconnect with the second impurity layer.

8. The nonvolatile semiconductor memory device as defined in claim 7,
wherein the source interconnects include a third interconnect extending along the row direction, and a fourth interconnect extending along the column direction, and
wherein at least one of the first source line connection sections includes a second source line connection section which connects the third interconnect with the fourth interconnect.

9. A nonvolatile semiconductor memory device comprising:
a memory cell array in which a plurality of memory cells are arranged in a row direction and a column direction,
wherein the memory cell array includes a plurality of element isolation regions,
wherein each of the memory cells includes a first impurity layer, a second impurity layer, a channel region located between the first impurity layer and the second impurity layer, a word gate and a select gate disposed to face the channel region, and a nonvolatile memory element formed between the word gate and the channel region,
wherein a first wordline connection section, which connects at least one of a plurality of word gate interconnects with at least one of the word gates, is disposed over at least one of the element isolation regions,
wherein the memory cell array includes a plurality of memory blocks,
wherein each of the memory blocks includes the memory cells,
wherein the memory cells includes a plurality of word gate rows, each of the word gate rows is formed by connecting the word gates in the memory cells arranged in the row direction,
wherein the nonvolatile semiconductor memory device further includes a plurality of common connection sections, each of the common connection sections connecting two of the word gate rows adjacent in the column direction over one of the element isolation regions on which the first wordline connection section is disposed, and
wherein each of the word gates in the memory block is connected with all of the word gate interconnects in the memory block.

10. The nonvolatile semiconductor memory device as defined in claim 9,
wherein an operation of erasing data held in each of the memory cells is performed at the same time for each of the memory blocks.

11. The nonvolatile semiconductor memory device as defined in claim 9,
wherein each of the word gate interconnects includes a first interconnect extending along the row direction, and a second interconnect extending along the column direction, and
wherein a second wordline connection section, which connects one of the common connection sections with the second interconnect, is disposed over at least one of the element isolation regions.

12. The nonvolatile semiconductor memory device as defined in claim 11,
wherein the first wordline connection section includes the second wordline connection section.

* * * * *